United States Patent
Kojima et al.

(10) Patent No.: US 8,994,030 B2
(45) Date of Patent: Mar. 31, 2015

(54) SEMICONDUCTOR LIGHT EMITTING DEVICE

(75) Inventors: Akihiro Kojima, Kanagawa-ken (JP);
Hideto Furuyama, Kanagawa-ken (JP);
Miyoko Shimada, Kanagawa-ken (JP);
Yosuke Akimoto, Kanagawa-ken (JP);
Hideyuki Tomizawa, Gunma-ken (JP);
Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 13/598,504

(22) Filed: Aug. 29, 2012

(65) Prior Publication Data
US 2013/0285064 A1 Oct. 31, 2013

(30) Foreign Application Priority Data

Apr. 27, 2012 (JP) .................................. 2012-103361

(51) Int. Cl.
*H01L 33/44* (2010.01)

(52) U.S. Cl.
CPC ...................................... *H01L 33/44* (2013.01)
USPC .......... 257/76; 257/88; 257/98; 257/E33.025; 257/E33.061; 257/E33.073

(58) Field of Classification Search
CPC ......... H01L 33/32; H01L 33/40; H01L 33/42; H01L 33/44; H01L 33/46
See application file for complete search history.

(56) References Cited

U.S. PATENT DOCUMENTS

| | | | |
|---|---|---|---|
| 5,893,957 A * | 4/1999 | Suzuki .......................... | 156/230 |
| 6,686,676 B2 * | 2/2004 | McNulty et al. .............. | 313/112 |
| 8,017,956 B2 * | 9/2011 | Furuyama ..................... | 257/89 |
| 8,110,421 B2 | 2/2012 | Sugizaki et al. | |
| 8,288,937 B2 * | 10/2012 | Ishii et al. ..................... | 313/503 |
| 8,729,797 B2 * | 5/2014 | Lee et al. ...................... | 313/512 |
| 2004/0108464 A1 * | 6/2004 | Fukui et al. .................. | 250/484.4 |
| 2004/0134416 A1 * | 7/2004 | Furuyama ..................... | 117/84 |
| 2005/0093008 A1 * | 5/2005 | Suehiro et al. ................ | 257/98 |
| 2006/0054913 A1 * | 3/2006 | Hadame et al. ............... | 257/99 |
| 2007/0023763 A1 * | 2/2007 | Takigawa et al. .............. | 257/79 |
| 2008/0032142 A1 * | 2/2008 | Tasumi et al. ................ | 428/447 |
| 2008/0211386 A1 * | 9/2008 | Choi et al. .................... | 313/503 |
| 2009/0278440 A1 * | 11/2009 | Yukinobu et al. ............. | 313/498 |
| 2010/0148198 A1 | 6/2010 | Sugizaki et al. | |

(Continued)

FOREIGN PATENT DOCUMENTS

| | | |
|---|---|---|
| JP | 2007103494 A | 4/2007 |
| JP | 2008056857 A | 3/2008 |

(Continued)

*Primary Examiner* — Minh-Loan Tran
*Assistant Examiner* — Fazli Erdem
(74) *Attorney, Agent, or Firm* — Patterson & Sheridan, LLP

(57) ABSTRACT

According to one embodiment, a semiconductor light emitting device includes a semiconductor layer, a p-side electrode, an n-side electrode, a phosphor layer, and a transparent film. The semiconductor layer has a first face, a second face opposite to the first face, and a light emitting layer. The p-side electrode is provided on the second face in an area including the light emitting layer. The n-side electrode is provided on the second face in an area not including the light emitting layer. The phosphor layer is provided on the first face. The phosphor layer includes a transparent resin and phosphor dispersed in the transparent resin. The transparent film is provided on the phosphor layer and has an adhesiveness lower than an adhesiveness of the transparent resin.

27 Claims, 27 Drawing Sheets

(56) References Cited

U.S. PATENT DOCUMENTS

| | | | |
|---|---|---|---|
| 2010/0213485 A1* | 8/2010 | McKenzie et al. | 257/98 |
| 2010/0277887 A1* | 11/2010 | Su et al. | 362/19 |
| 2011/0006334 A1* | 1/2011 | Ishii et al. | 257/98 |
| 2011/0147778 A1* | 6/2011 | Ichikawa | 257/98 |
| 2011/0260184 A1* | 10/2011 | Furuyama | 257/98 |
| 2012/0012869 A1* | 1/2012 | Song | 257/91 |
| 2012/0052608 A1* | 3/2012 | Yoo et al. | 438/27 |
| 2013/0069095 A1* | 3/2013 | Hodota | 257/98 |
| 2013/0105850 A1* | 5/2013 | Komatsu et al. | 257/98 |
| 2013/0149508 A1* | 6/2013 | Kwak et al. | 428/201 |
| 2013/0178006 A1* | 7/2013 | Kim et al. | 438/33 |
| 2013/0248915 A1* | 9/2013 | Shimada et al. | 257/99 |
| 2013/0285077 A1* | 10/2013 | Kojima et al. | 257/88 |
| 2014/0091334 A1* | 4/2014 | Katayama et al. | 257/88 |

FOREIGN PATENT DOCUMENTS

| | | |
|---|---|---|
| JP | 2008222881 A | 9/2008 |
| JP | 2010043136 A | 2/2010 |
| JP | 2011126994 A | 6/2011 |
| WO | WO2011/005228 | 9/2011 |
| WO | 2012/123998 | 9/2012 |

* cited by examiner

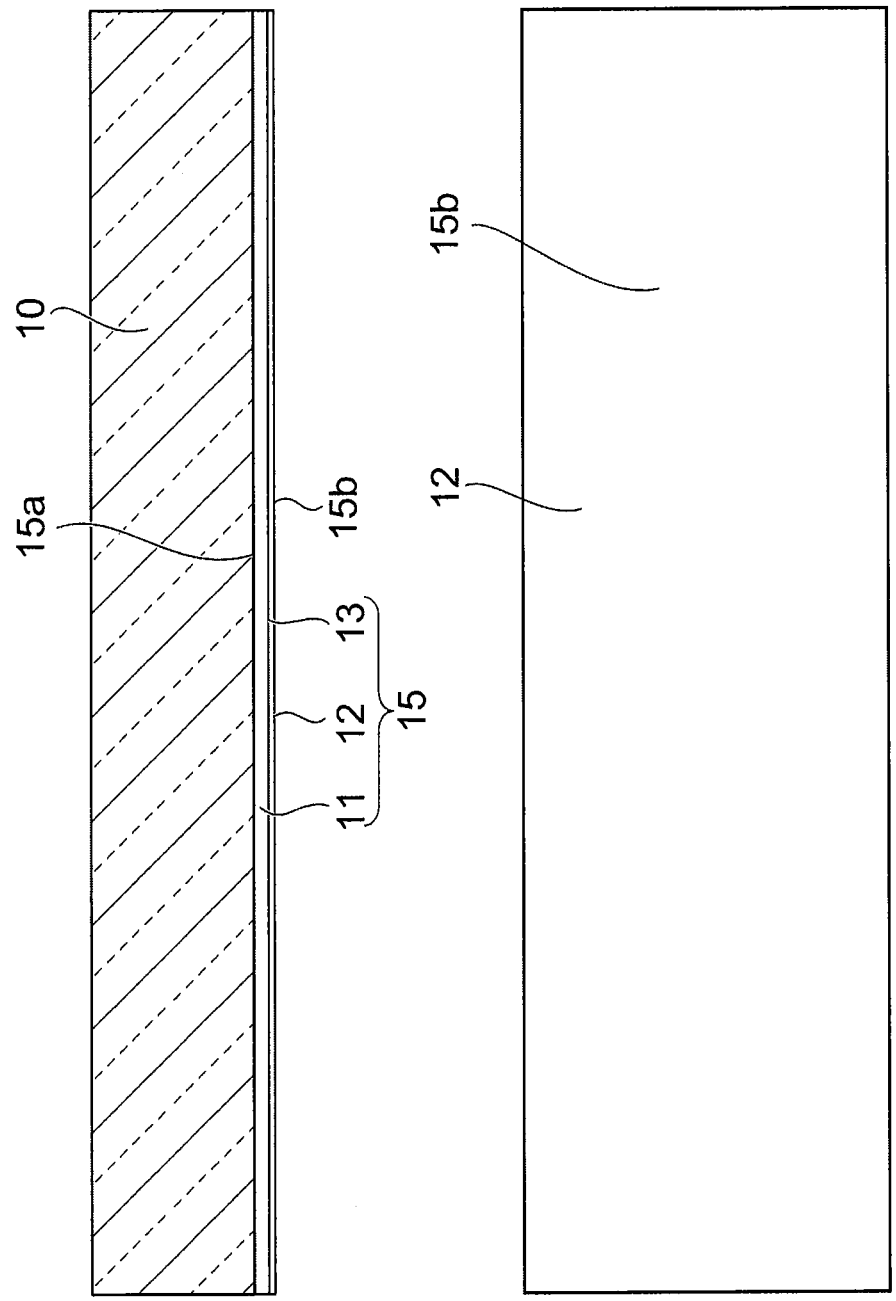

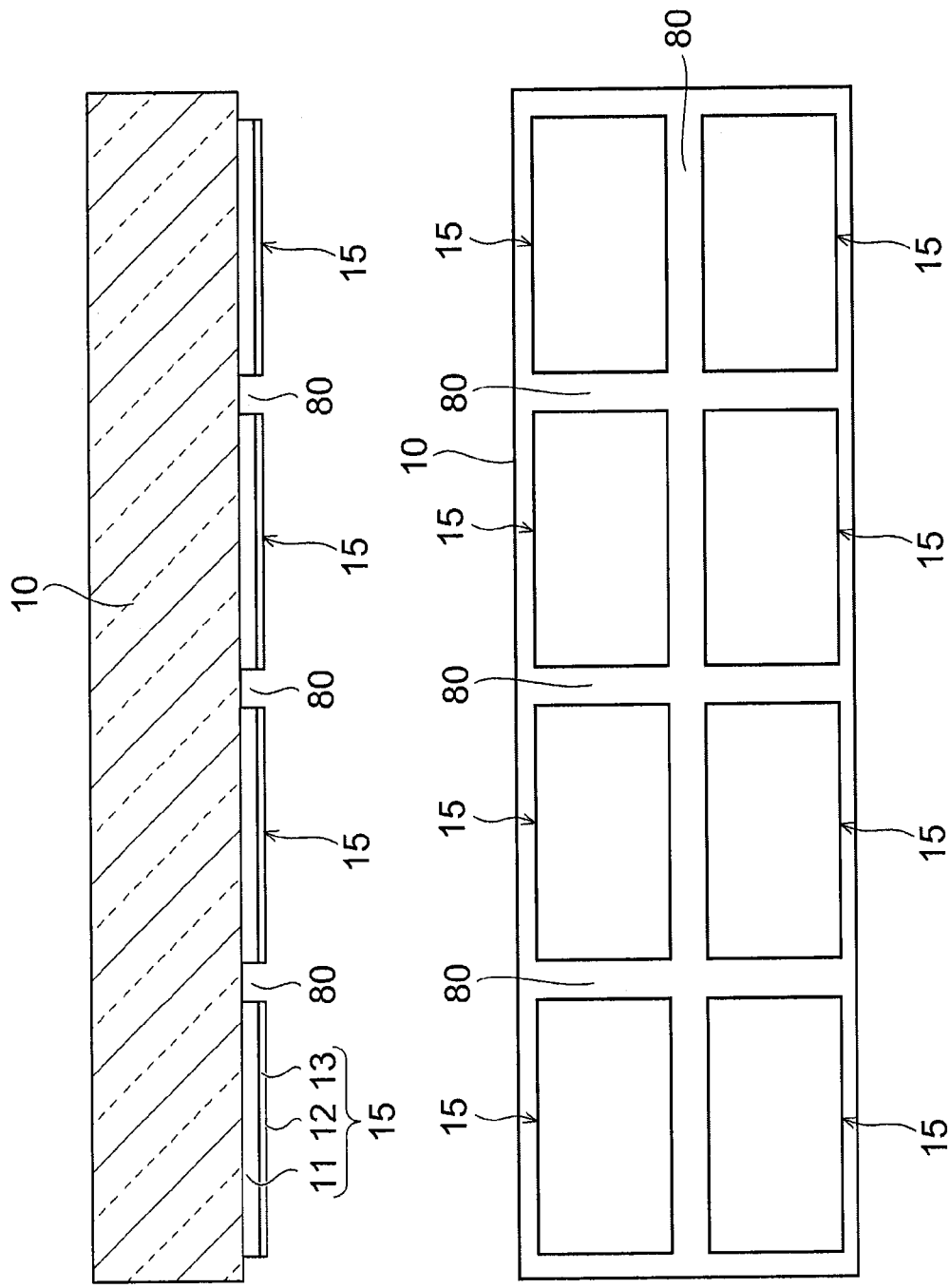

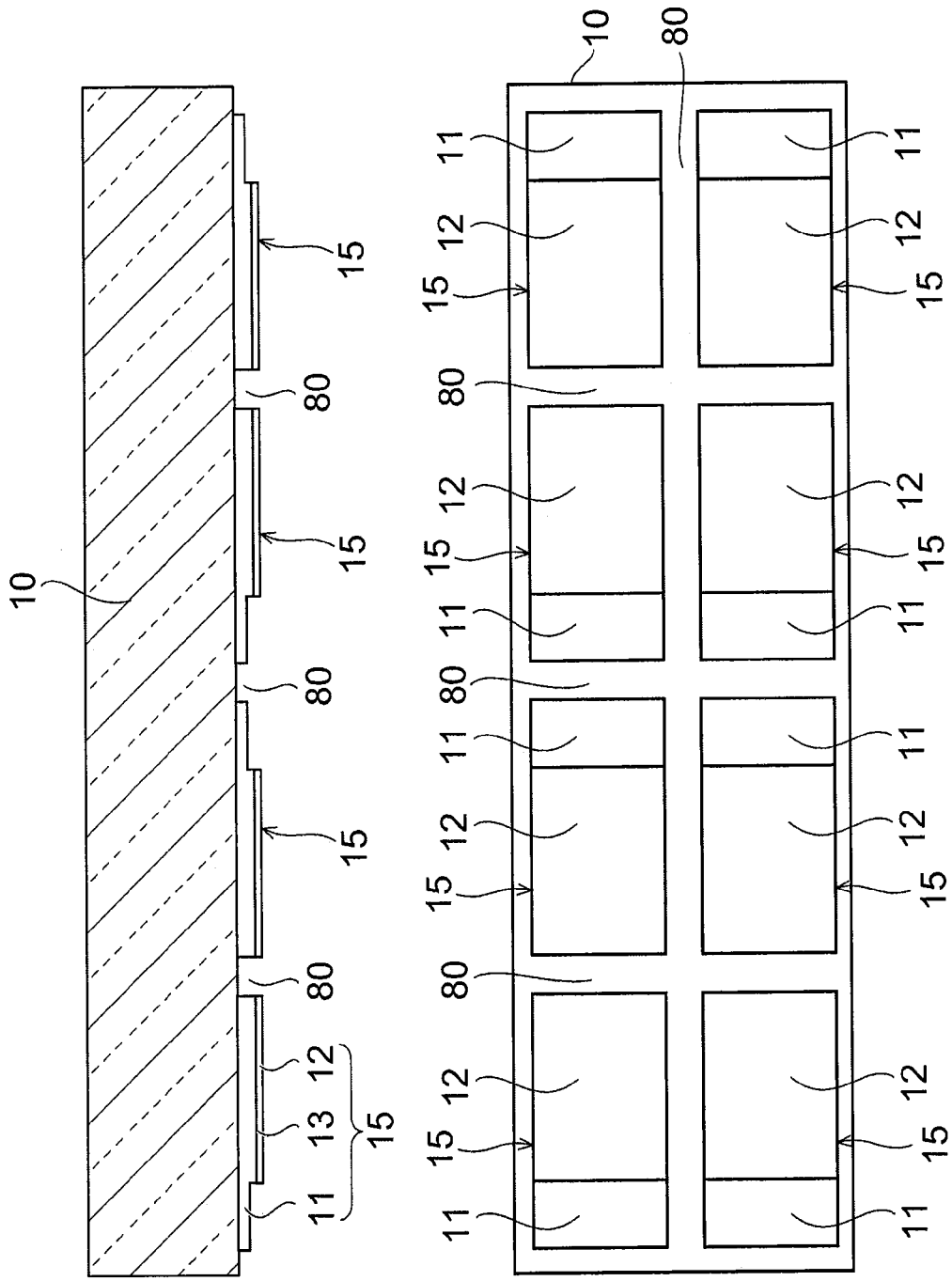

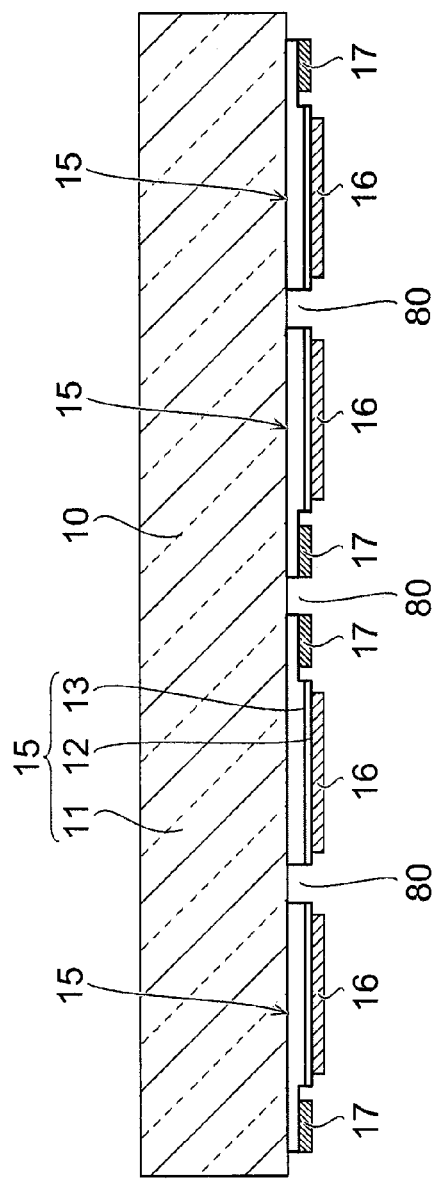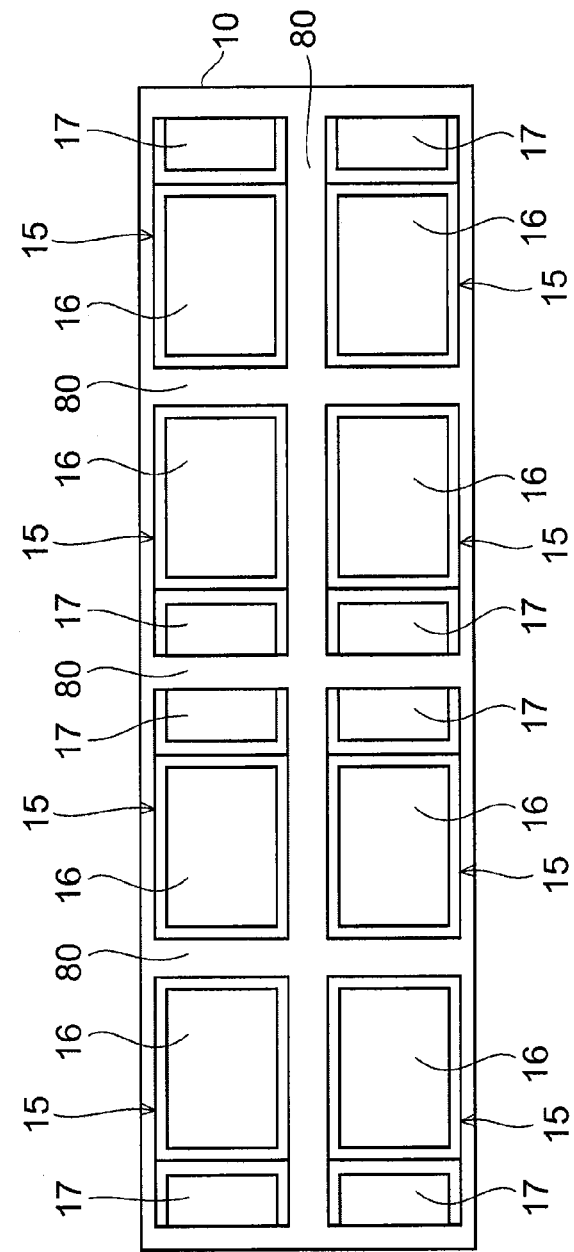
FIG. 5A
FIG. 5B

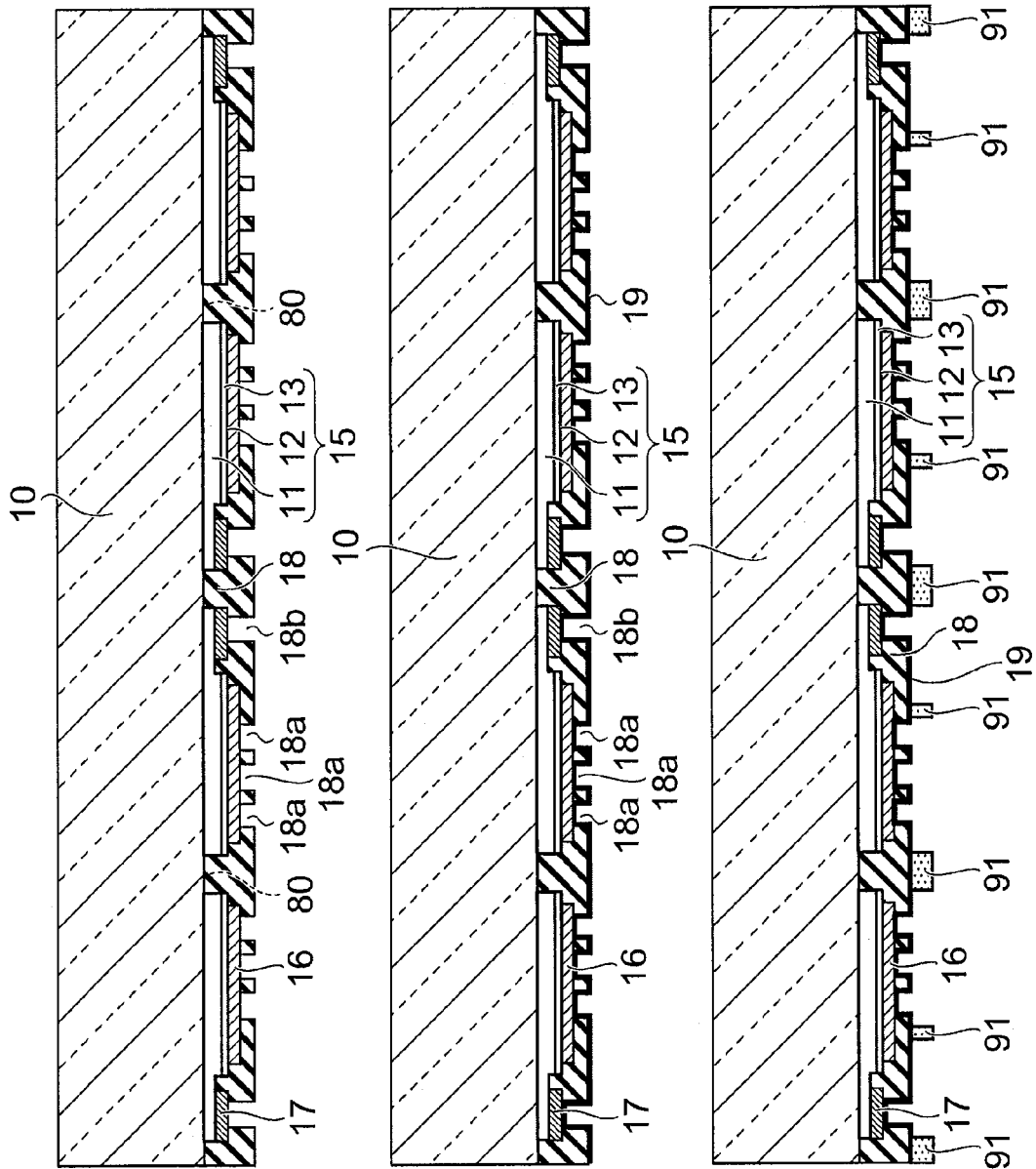

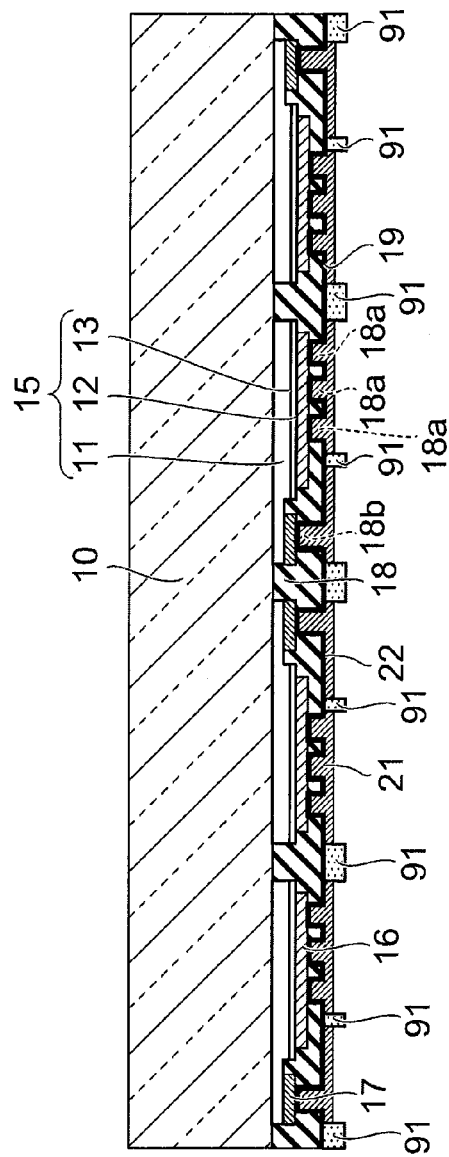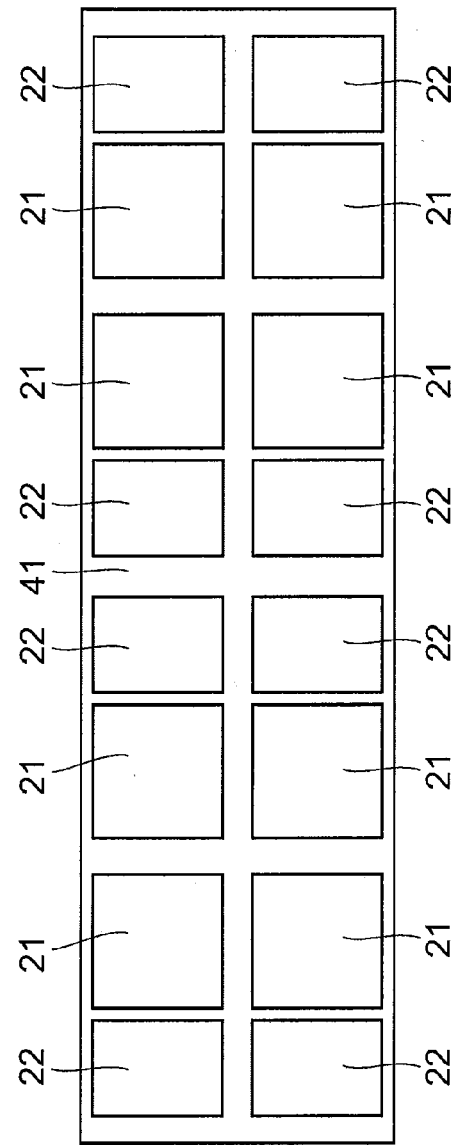
FIG. 7A
FIG. 7B

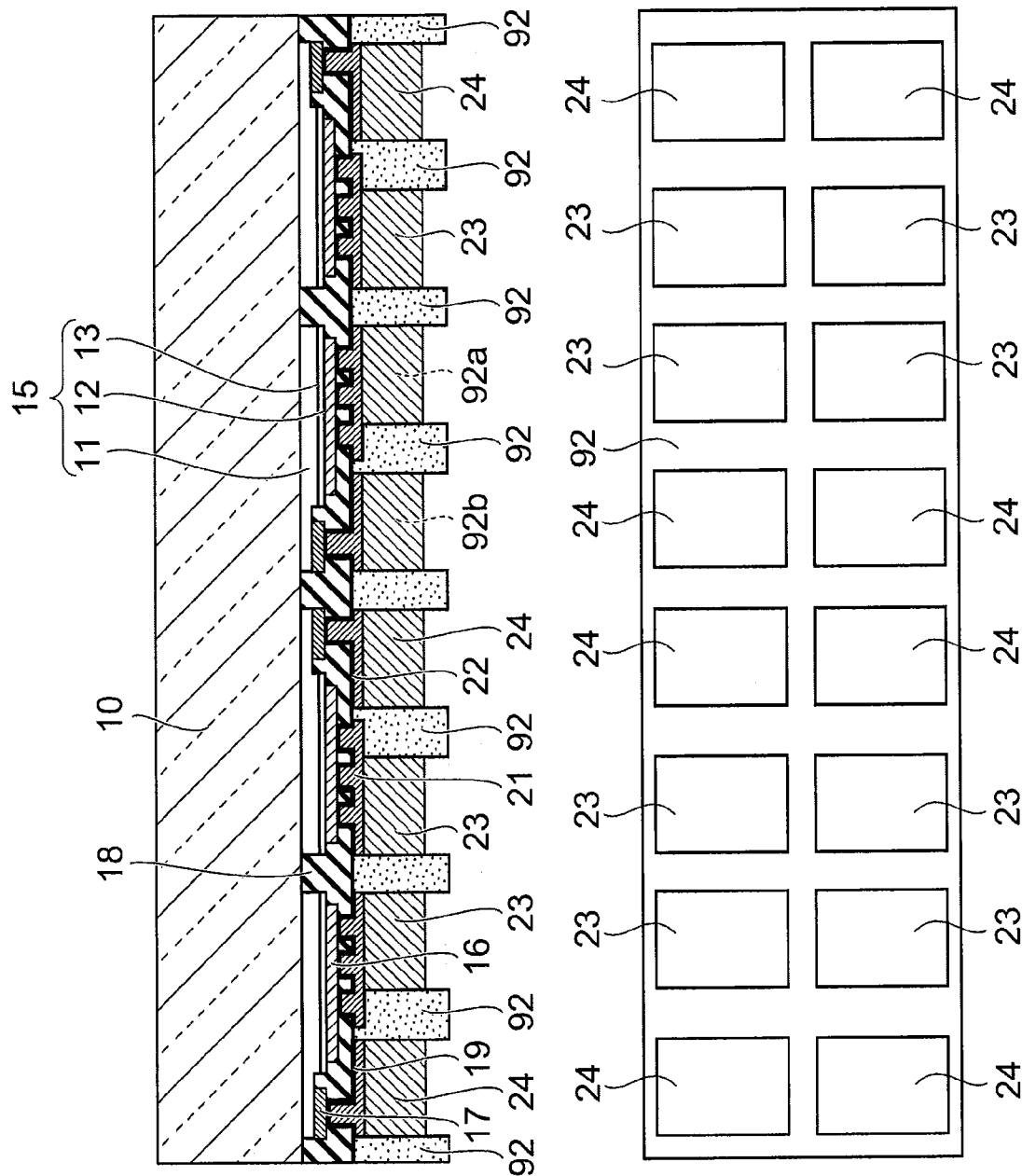

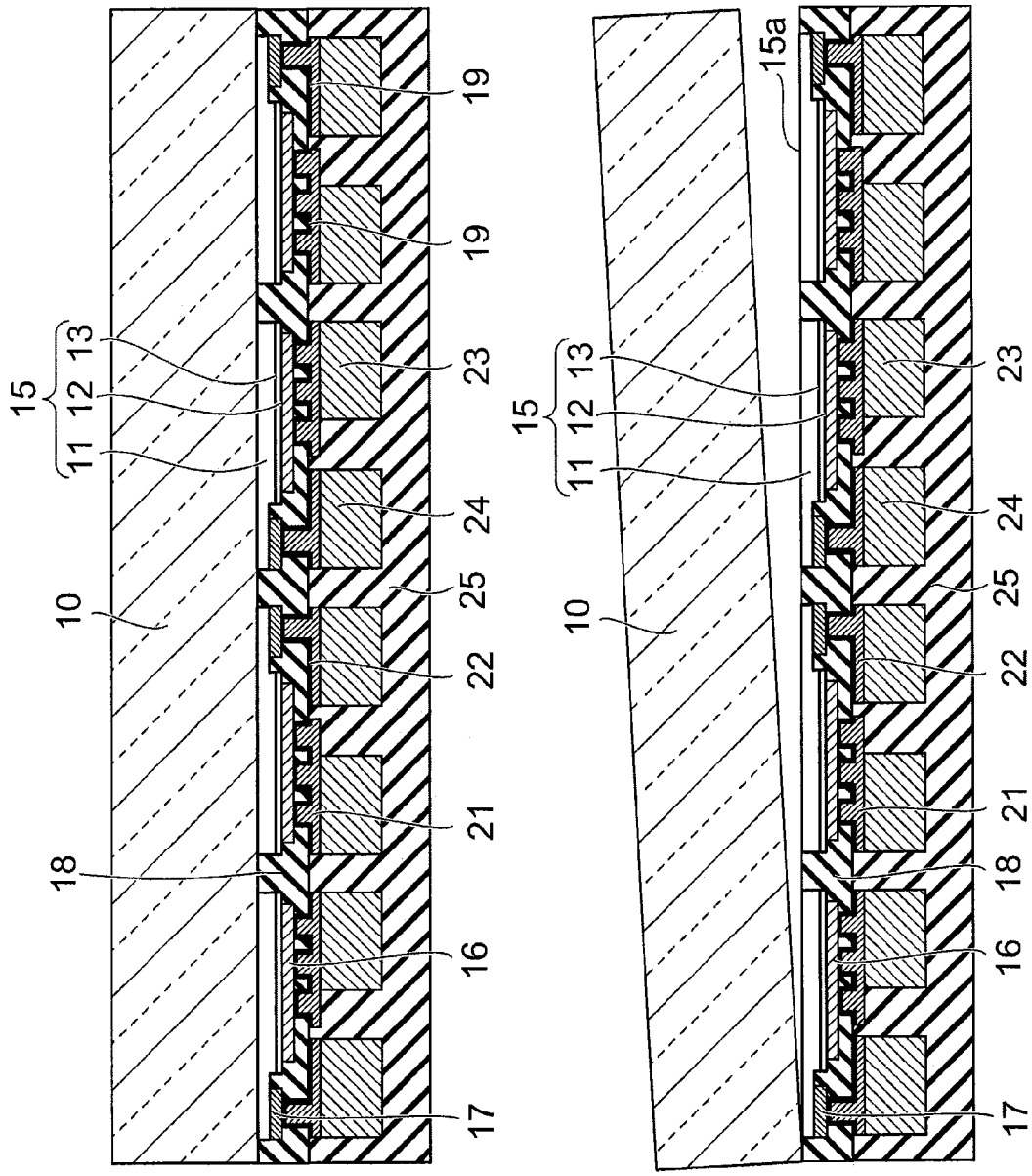

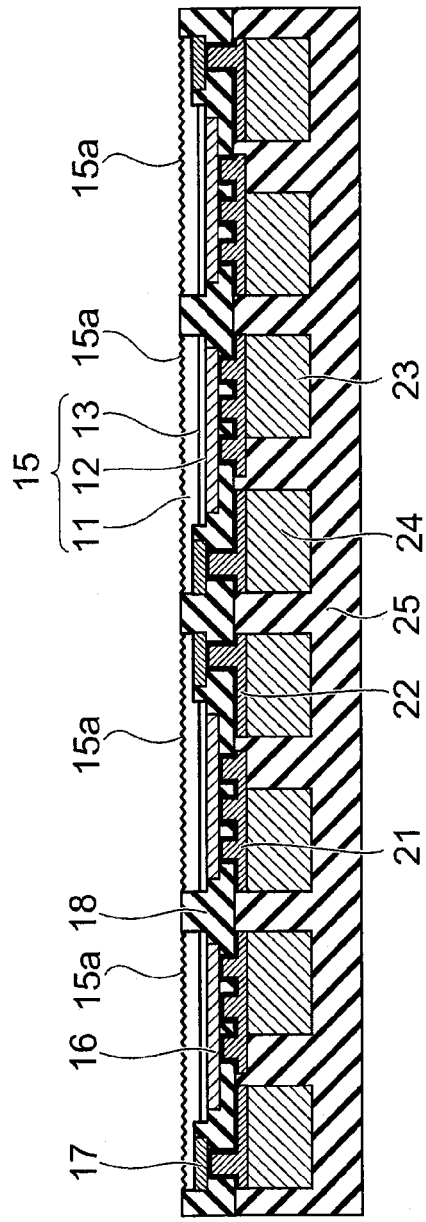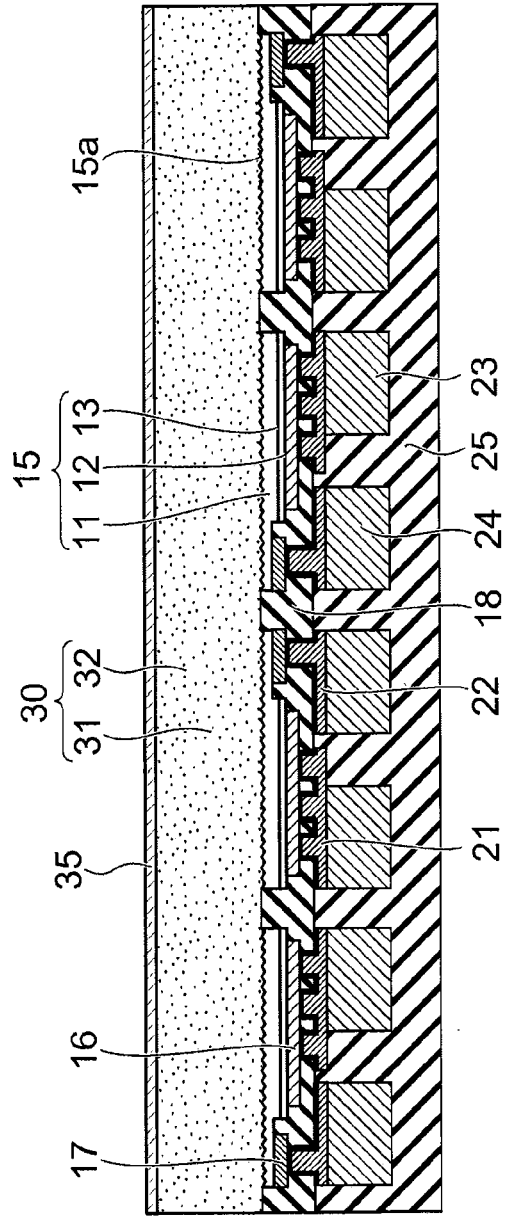
FIG. 12A
FIG. 12B

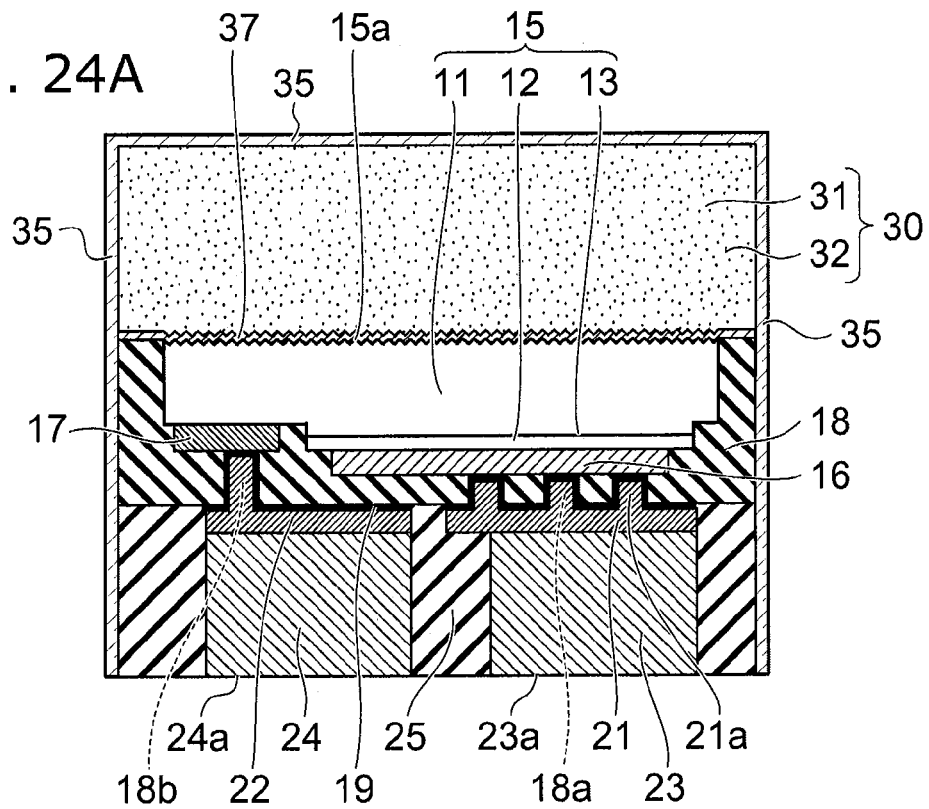
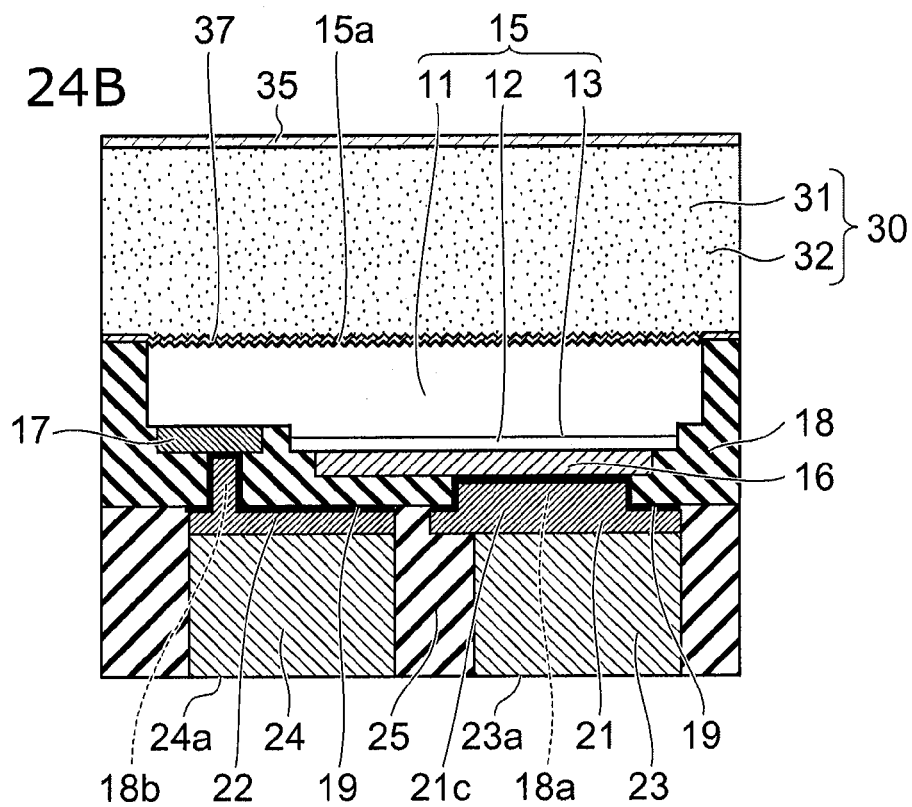

SEMICONDUCTOR LIGHT EMITTING DEVICE

CROSS-REFERENCE TO RELATED APPLICATION

This application is based upon and claims the benefit of priority from Japanese Patent Application No. 2012-103361, filed on Apr. 27, 2012; the entire contents of which are incorporated herein by reference.

FIELD

Embodiments described herein relate generally to a semiconductor light emitting device.

BACKGROUND

In a semiconductor light emitting device having a configuration in which any electrode is not provided on a light extracting surface, and a p-side electrode and an n-side electrode are provided on a side opposite to the light extracting surface, as the configuration of the light extracting surface, a configuration that does not degrade the light extracting efficiency and the handling property is requested.

BRIEF DESCRIPTION OF THE DRAWINGS

FIGS. 2A to 14B are schematic views showing a method for manufacturing the light emitting device of the first embodiment;

FIGS. 24A to 27B are schematic cross-sectional views of a light emitting device of still another specific example of the third embodiment.

DETAILED DESCRIPTION

Figure 1:
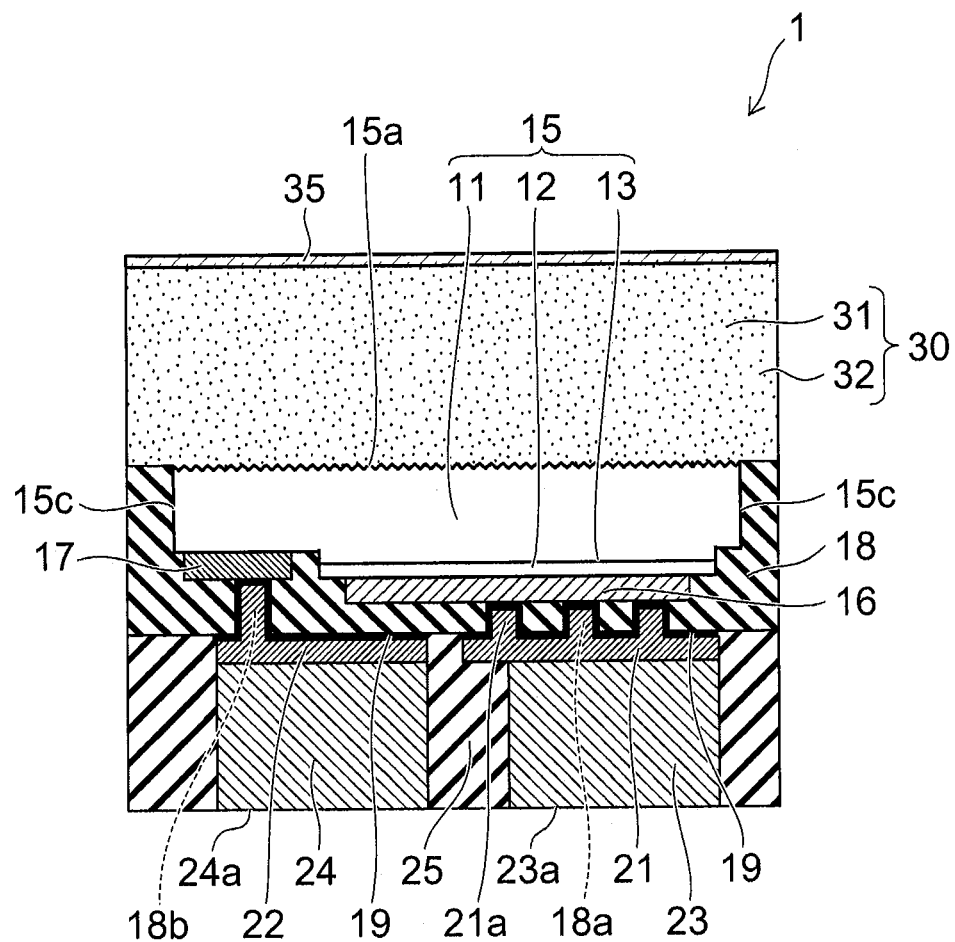
FIG. 1 is a schematic cross-sectional view of a light emitting device of a first embodiment.

According to one embodiment, a semiconductor light emitting device includes a semiconductor layer, a p-side electrode, an n-side electrode, a phosphor layer, and a transparent film. The semiconductor layer has a first face, a second face opposite to the first face, and a light emitting layer. The p-side electrode is provided on the second face in an area including the light emitting layer. The n-side electrode is provided on the second face in an area not including the light emitting layer. The phosphor layer is provided on the first face. The phosphor layer includes a transparent resin and phosphor dispersed in the transparent resin. The transparent film is provided on the phosphor layer and has an adhesiveness lower than an adhesiveness of the transparent resin.

Hereinafter, embodiments will be described with reference to the drawings. Like reference numerals in the drawings denote like elements.

First Embodiment

FIG. 1 is a schematic cross-sectional view of a semiconductor light emitting device 1 according to a first embodiment.

The semiconductor light emitting device 1 includes a semiconductor layer 15 that includes a light emitting layer 13. In addition, the semiconductor layer 15 has a first face 15a and a second face that is located on a side opposite to the first face 15a. On a second face side, electrodes and a interconnection part are provided, and light is emitted mainly to the outer side from the first face 15a on which the electrodes and the interconnection part are not provided.

The semiconductor layer 15 includes a first semiconductor layer 11 and a second semiconductor layer 12. The first semiconductor layer 11 and the second semiconductor layer 12, for example, contain gallium nitride. The first semiconductor layer 11, for example, includes an underlying buffer layer, an n-type GaN layer, and the like. The second semiconductor layer 12 includes a p-type GaN layer, a light emitting layer (active layer) 13, and the like. As the material of the light emitting layer 13, a material that emits blue light, purple light, blue-purple light, ultraviolet light, or the like may be used.

The second face of the semiconductor layer 15 is processed in a concavo-convex shape, and a convex part includes the light emitting layer 13. On the surface of the second semiconductor layer 12 that is the surface of the convex part, a p-side electrode 16 is provided. In other words, the p-side electrode 16 is provided on the second face that is disposed in an area in which the light emitting layer 13 is included.

On a side of the convex part on the second face of the semiconductor layer 15, an area that does not include the light emitting layer 13 is provided, and an n-side electrode 17 is provided in the area on the surface of the first semiconductor layer 11. In other words, the n-side electrode 17 is provided in an area, which does not include the light emitting layer 13, on the second face.

As shown in FIG. 4B, on the second face of the semiconductor layer 15, the area of the second semiconductor layer 12 that includes the light emitting layer 13 is larger than the area of the first semiconductor layer 11 that does not include the light emitting layer 13.

In addition, as shown in FIG. 5B, on the semiconductor layer 15, the area of the p-side electrode 16 that is provided in the area that includes the light emitting layer 13 is larger than the area of the n-side electrode 17 that is provided in the area that does not include the light emitting layer 13. Accordingly, a relatively wide light emitting area is acquired. Here, the layout of the p-side electrodes 16 and the n-side electrodes 17, which is shown in FIG. 5B, is an example, and the embodiment is not limited thereto.

On a second face side of the semiconductor layer 15, a first insulating film (hereinafter, simply referred to as an insulating film) 18 is provided. The insulating film 18 covers the semiconductor layer 15, the p-side electrode 16, and the n-side electrode 17. In addition, the insulating film 18 covers the side surfaces of the light emitting layer 13 and the second semiconductor layer 12 for the protection of the side surfaces and the second semiconductor layer 12.

In addition, another insulating film (for example, a silicon oxide film) may be provided between the insulating film 18 and the semiconductor layer 15. The insulating film 18, for example, is formed of a resin such as polyimide that has fine openings and superior patterning characteristics. Alternatively, as the material of the insulating film 18, an inorganic film such as a silicon oxide film or a silicon nitride film may be used.

The insulating film 18 is not provided on the first face 15a of the semiconductor layer 15. The insulating film 18 covers a side surface 15c that extends from the first face 15a of the semiconductor layer 15 for the protection the side surface 15c.

On a face of the insulating film 18 that is disposed on a side opposite to the second face of the semiconductor layer 15, a p-side interconnection layer 21 and an n-side interconnection layer 22 are provided so as to be separated from each other.

The p-side interconnection layer 21 is also provided inside a plurality of first openings 18a that are formed in the insulating film 18 up to the p-side electrodes 16 and is electrically connected to the p-side electrodes 16. The n-side interconnection layer 22 is also provided inside a second opening 18b that is formed in the insulating film 18 up to the n-side electrodes 17 and is electrically connected to the n-side electrodes 17.

On a face of the p-side interconnection layer 21 that is disposed on a side opposite to the p-side electrode 16, a p-side metal pillar 23 is provided. The p-side interconnection layer 21, the p-side metal pillar 23, and a metal film 19 that is used as a seed layer to be described later configure a p-side interconnection part according to the embodiment.

On a face of the n-side interconnection layer 22 that is disposed on a side opposite to the n-side electrodes 17, an n-side metal pillar 24 is provided. The n-side interconnection layer 22, the n-side metal pillar 24, and the metal film 19 that is used as a seed layer to be described later configure an n-side interconnection part according to the embodiment.

In the insulating film 18, for example, a resin layer 25 as a second insulating film is stacked. The resin layer 25 covers the periphery of the p-side interconnection part and the periphery of the n-side interconnection part. In addition, the resin layer 25 is filled up between the p-side metal pillar 23 and the n-side metal pillar 24.

The side surface of the p-side metal pillar 23 and the side surface of the n-side metal pillar 24 are covered with the resin layer 25. A face of the p-side metal pillar 23 that is disposed on a side opposite to the p-side interconnection layer 21 is exposed from the resin layer 25 and serves as a p-side external terminal 23a. A face of the n-side metal pillar 24 that is disposed on a side opposite to the n-side interconnection layer 22 is exposed from the resin layer 25 and serves as an n-side external terminal 24a.

The p-side external terminal 23a and the n-side external terminal 24a are bonded to a pad that is formed in a mounting substrate through a bonding member formed of solder, other metal, a material having conductivity, or the like.

A distance between the p-side external terminal 23a and the n-side external terminal 24a that are exposed on the same face (the lower face in FIG. 1) of the resin layer 25 is longer than a distance between the p-side interconnection layer 21 and the n-side interconnection layer 22 on the insulating film 18. The p-side external terminal 23a and the n-side external terminal 24a are separated from each other by such a distance that the external terminals do not form a short circuit through solder or the like at the time of being mounted on the mounting substrate.

The p-side interconnection layer 21 can approach the n-side interconnection layer 22 up to a process limit, and accordingly, the area of the p-side interconnection layer 21 can be widened. As a result, a contact area between the p-side interconnection layer 21 and the p-side electrode 16 increases, whereby the current distribution and the heat dissipation can be improved.

The area of the p-side interconnection layer 21 that is in contact with the p-side electrodes 16 through the plurality of first openings 18a is larger than the area of the n-side interconnection layer 22 that is in contact with the n-side electrodes 17 through the second openings 18b. Accordingly, the current distribution toward the light emitting layer 13 is improved, and the heat dissipation of the light emitting layer 13 can be improved.

The area of the n-side interconnection layer 22 that extends on the insulating film 18 is larger than the area of the n-side interconnection layer 22 that is in contact with the n-side electrodes 17.

According to the embodiment, since the light emitting layer 13 is formed over an area that is larger than the area of the n-side electrode 17, a high optical output can be acquired. In addition, the n-side electrode 17 that is provided in an area that is smaller than an area including the light emitting layer 13 appears on the mounting face side as the n-side interconnection layer 22 having a larger area.

The first semiconductor layer 11 is electrically connected to the n-side metal pillar 24 having the n-side external terminal 24a through the n-side electrode 17, the metal film 19, and the n-side interconnection layer 22. The second semiconductor layer 12 including the light emitting layer 13 is electrically connected to the p-side metal pillar 23 having the p-side external terminal 23a through the p-side electrode 16, the metal film 19, and the p-side interconnection layer 21.

The p-side metal pillar 23 is thicker than the p-side interconnection layer 21, and the n-side metal pillar 24 is thicker than the n-side interconnection layer 22. The thickness of each one of the p-side metal pillar 23, the n-side metal pillar 24, and the resin layer 25 is larger than that of the semiconductor layer 15. Here, the "thickness" represents a thickness in the vertical direction in FIG. 1.

In addition, the thickness of each one of the p-side metal pillar 23 and the n-side metal pillar 24 is larger than that of a stacked body that includes the semiconductor layer 15, the p-side electrode 16, the n-side electrode 17, and the insulating film 18. In addition, the aspect ratio (the ratio of the thickness to the planar size) of each one of the metal pillars 23 and 24 is not limited to be one or more, and the ratio may be less than one. In other words, the thickness of each one of the metal pillars 23 and 24 may be smaller than the planar size of the metal pillars 23 and 24.

According to the embodiment, even when a substrate 10, which will be described later, that is used for forming the semiconductor layer 15 is removed, the semiconductor layer 15 is stably supported by the p-side metal pillar 23, the n-side metal pillar 24, and the resin layer 25, whereby the mechanical strength of the semiconductor light emitting device 1 can be improved.

As the materials of the p-side interconnection layer 21, the n-side interconnection layer 22, the p-side metal pillar 23, and the n-side metal pillar 24, copper, gold, nickel, silver, and the like can be used. Among these materials, when copper is used, good thermal conductivity, high migration resistance, and superior adhesiveness to an insulating material are obtained.

The resin layer 25 reinforces the p-side metal pillar 23 and the n-side metal pillar 24. It is preferable that the resin layer 25 having a coefficient of thermal expansion that is the same as or close to the coefficient of thermal expansion of the mounting substrate be used. As examples of such a resin layer 25, there are an epoxy resin, a silicone resin, a fluorine resin, and the like.

In addition, in a state in which the semiconductor light emitting device 1 is mounted on the mounting substrate through the p-side external terminal 23a and the n-side external terminal 24a, the stress applied to the semiconductor layer 15 through soldering or the like can be absorbed by the p-side metal pillar 23 and the n-side metal pillar 24 so as to be relieved.

The p-side interconnection part that includes the p-side interconnection layer 21 and the p-side metal pillar 23 is connected to the p-side electrode 16 through a plurality of vias 21a that are provided inside the plurality of first openings 18a and are separated from each other. Accordingly, a high stress relieving effect can be acquired through the p-side interconnection part.

Figure 15A:
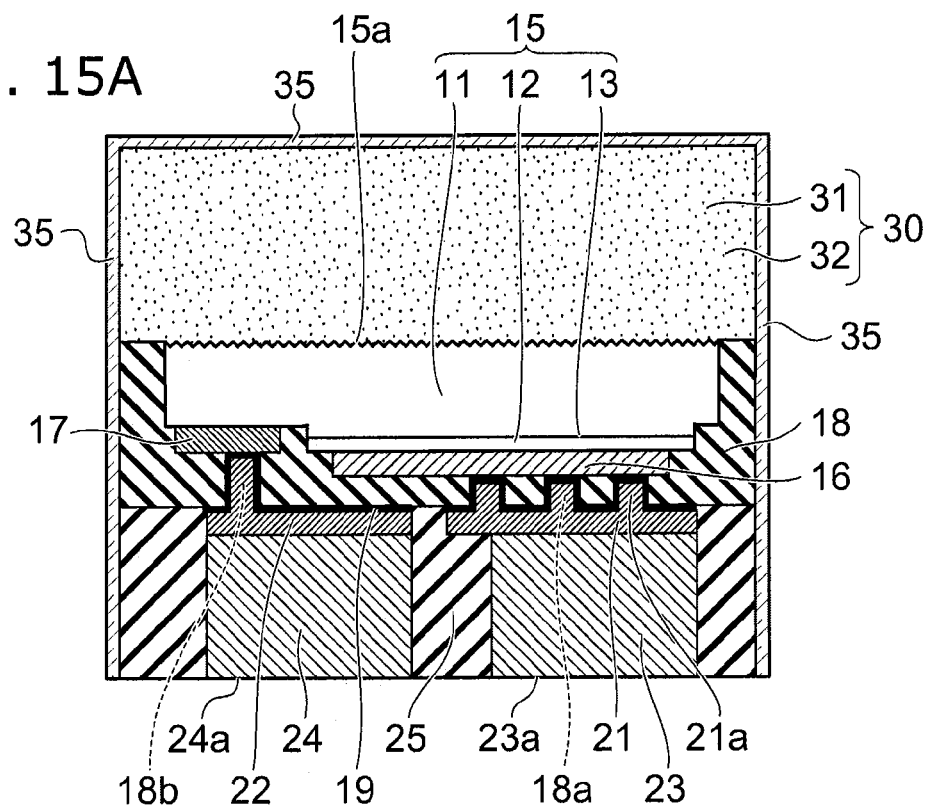
FIGS. 15A and 15B are schematic cross-sectional views of a light emitting device of another specific example of the first embodiment.
Figure 15B:
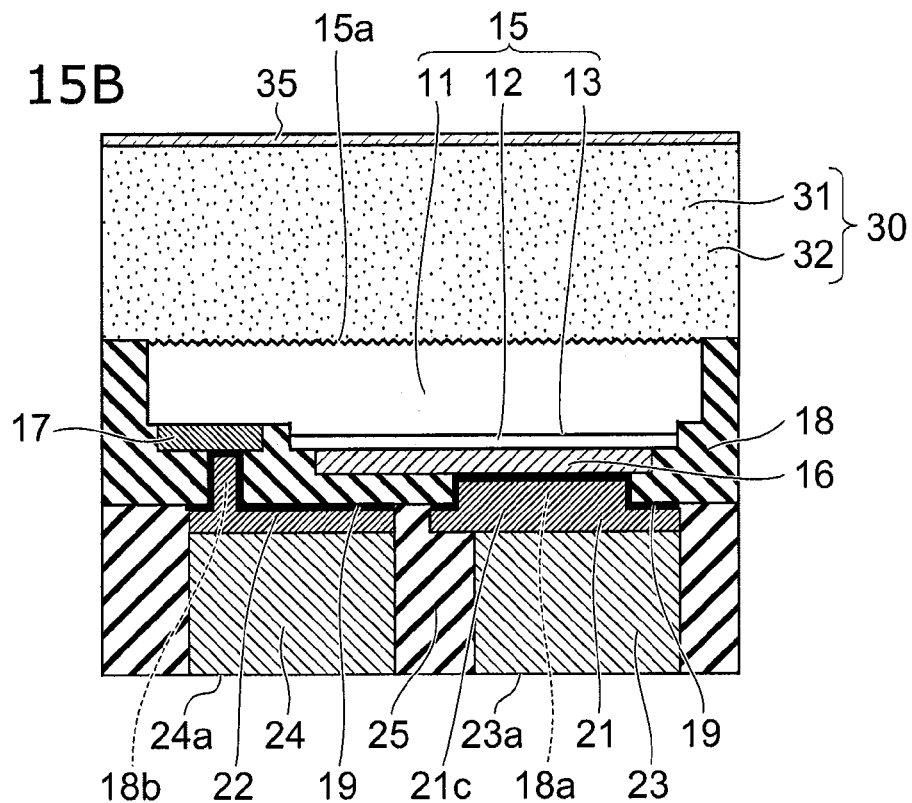

Alternatively, as shown in FIG. 15B, the p-side interconnection layer 21 may be connected to the p-side electrode 16 through a post 21c that is provided inside one large first opening 18a and has a planar size larger than the via 21a. In such a case, the heat dissipation of the light emitting layer 13 can be improved through the p-side electrode 16, the p-side interconnection layer 21, and the p-side metal pillar 23, all of which are formed of metal.

As will be described later, the substrate 10 that is used when the semiconductor layer 15 is formed is removed from the first face 15a. Accordingly, the height of the semiconductor light emitting device 1 can be lowered.

On the first face 15a of the semiconductor layer 15, a fine concavo-convex is formed. By performing wet etching (frost process), for example, using an alkali-based solution for the first face 15a, the concavo-convex is formed. By providing the concavo-convex on the first face 15a that is a main emission light extracting face of the light emitting layer 13, light can be extracted outside of the first face 15a without allowing light incident to the first face 15a at various angles to be totally reflected.

On the first face 15a, a phosphor layer 30 is provided. The phosphor layer 30 includes a transparent resin 31 and a plurality of phosphor 32, which have a particle or power form, dispersed in the transparent resin 31.

The transparent resin 31 has transparency for emission light emitted from the light emitting layer 13 and emission light emitted from the phosphor 32. As the transparent resin 31, for example, a silicone resin, an acrylic resin, a phenyl resin, or the like may be used.

The phosphor 32 can absorb emission light (excited light) emitted from the light emitting layer 13 and emit wavelength-converted light. Accordingly, the semiconductor light emitting device 1 can emit mixed light of the emission light emitted from the light emitting layer 13 and the wavelength-converted light of the phosphor 32.

For example, in a case where the phosphor 32 is a yellow phosphor that emits yellow light, as a mixed color of blue light of the light emitting layer 13 of which the material is a GaN-based material and yellow light that is the wavelength-converted light of the light emitted from the phosphor 32, a white color, a light bulb color, or the like can be acquired. In addition, the phosphor layer 30 may be configured to contain a plurality of types of phosphor (for example, a red phosphor that emits red light and a green phosphor that emits green light).

On the top face of the phosphor layer 30, a transparent film 35 is provided. The transparent film 35 has transparency for the emission light emitted from the light emitting layer 13 and the emission light emitted from the phosphor 32. For example, the transparent film 35 is a silicon oxide film, a silicon nitride film, a silicon oxynitride film, or an acrylic resin film.

Figure 14A:
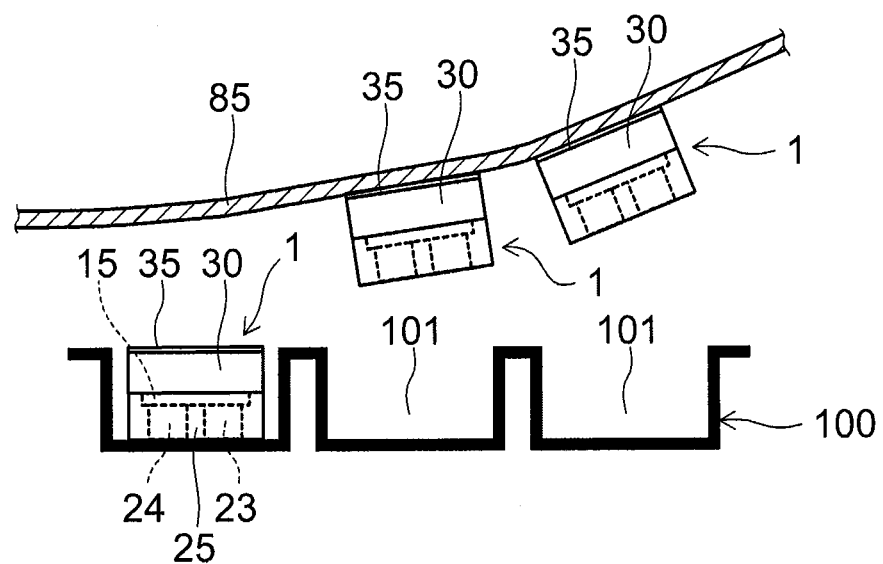

The transparent film 35 has adhesiveness (tackiness) lower than that of the transparent resin 31 of the phosphor layer 30. Accordingly, as will be described later, a force that is required for peeling off a cover tape 85, which is shown in FIG. 14A, attached to the transparent film 35 from the transparent film 35 at a constant speed is smaller than a force that is required for peeling off the cover tape 85 attached to the transparent resin 31 of the phosphor layer 30 from the transparent resin 31 at a constant speed.

In addition, the transparent film 35 is thinner than the phosphor layer 30. Accordingly, the optical diffusion in the transparent film 35 in the horizontal direction is suppressed, whereby the directivity of light in a direction that is perpendicular to the light extracting face can be strengthened.

Furthermore, in a case where the transparent film 35 is formed to have a thickness that is equal to or less than ¼ of the wavelength of light in the transparent film 35, light reflection at an interface between the phosphor layer 30 and the transparent film 35 and an interface between the transparent film 35 and an air layer is suppressed, and accordingly, high light extracting efficiency can be acquired.

Next, a method of manufacturing the semiconductor light emitting device 1 according to the embodiment will be described with reference to FIGS. 2A to 13B. FIGS. 2A to 13B show partial areas in a wafer state.

FIG. 2A shows a stacked body that is acquired by forming a first semiconductor layer 11 and a second semiconductor layer 12 on a principal face (the lower face in FIG. 2A) of a substrate 10. FIG. 2B corresponds to a diagram of a lower face in FIG. 2A.

On the principal face of the substrate 10, the first semiconductor layer 11 is formed, and the second semiconductor layer 12 including a light emitting layer 13 is formed thereon. The first semiconductor layer 11 and the second semiconductor layer 12 that contain gallium nitride can be grown through a crystal growth method, for example, on a sapphire substrate by using a metal organic chemical vapor deposition (MOCVD) method. Alternatively, as the substrate 10, a silicon substrate can be also used.

A face of the first semiconductor layer 11 that is in contact with the substrate 10 is a first face 15a of the semiconductor layer 15, and the surface of the second semiconductor layer 12 is a second face 15b of the semiconductor layer 15.

Next, as shown in FIG. 3A and FIG. 3B that is a diagram of the lower face of FIG. 3A, a groove 80 that passes through the semiconductor layer 15 and reaches the substrate 10 is formed, for example, by using a reactive ion etching (RIE) method using a resist not shown in the diagram. The groove 80 is formed, for example, in a lattice pattern on the substrate 10 that is in the wafer state and separates the semiconductor layer 15 into a plurality of chips on the substrate 10.

In addition, the process of separating the semiconductor layer 15 into multiple parts may be performed after selective removal of the second semiconductor layer 12, which will be described later, or after the formation of electrodes.

Next, as shown in FIG. 4A and FIG. 4B that is a diagram of the lower face of FIG. 4A, parts of the second semiconductor layer 12 are removed so as to expose parts of the first semiconductor layer 11, for example, by using the RIE method using a resist not shown in the diagram. Each area in which the first semiconductor layer 11 is exposed does not include the light emitting layer 13.

Next, as shown in FIG. 5A and FIG. 5B that is a diagram of the lower face of FIG. 5A, p-side electrodes 16 and n-side electrodes 17 are formed on the second face of the semiconductor layer 15. The p-side electrodes 16 are formed on the surface of the second semiconductor layer 12. The n-side electrodes 17 are formed on the exposed faces of the first semiconductor layer 11.

The p-side electrodes 16 and the n-side electrodes 17, for example, are formed by using a sputtering method, a vapor deposition method, or the like. Either the p-side electrodes 16 or the n-side electrodes 17 may be formed first, or the p-side and n-side electrodes 16 and 17 may be simultaneously formed from the same material.

The p-side electrode 16 has reflectance for the emission light emitted from the light emitting layer 13, and examples of the material of the p-side electrode 16 include silver, silver alloy, aluminum, aluminum alloy, and the like. In addition, in order to prevent the sulfurization and the oxidization of the p-side electrode 16, the p-side electrode 16 may be configured to include a metal protective film (barrier metal).

In addition, between the p-side electrode 16 and the n-side electrode 17 or on the end face (side surface) of the light emitting layer 13, as a passivation film, for example, a silicon nitride film or a silicon oxide film may be formed by using a chemical vapor deposition (CVD) method. In addition, activated annealing for forming an ohmic contact between each electrode and the semiconductor layer and the like may be performed as necessary.

Next, after all the parts exposed on the principal face of the substrate 10 are covered with an insulating film 18 shown in FIG. 6A, the insulating film 18 is patterned, for example, by using wet etching, whereby first openings 18a and a second opening 18b are selectively formed in the insulating film 18. A plurality of the first openings 18a are formed, and each of the first openings 18a reaches the p-side electrodes 16. The second opening 18b reaches the n-side electrode 17.

As the material of the insulating film 18, for example, an organic material such as a photosensitive polyimide or benzocyclobutene can be used. In such a case, the insulating film 18 can be directly exposed and developed without using a resist.

Alternatively, an inorganic film such as a silicon nitride film or a silicon oxide film may be used as the insulating film 18. In a case where the insulating film 18 is an inorganic film, the first openings 18a and the second opening 18b are formed by etching after a resist formed on the insulating film 18 is patterned.

Next, as shown in FIG. 6B, a metal film 19 is formed on the surface of the insulating film 18, the inner walls (the side wall and the bottom portion) of the first opening 18a, and the inner wall (the side wall and the bottom portion) of the second opening 18b. The metal film 19 is used as a seed metal for plating, which will be described later.

The metal film 19, for example, is formed by using a sputtering method. The metal film 19, for example, includes a stacked film in which a titanium (Ti) layer and a copper (Cu) layer are stacked in order from the insulating film 18 side. Alternatively, an aluminum film may be used instead of the titanium film.

Next, as shown in FIG. 6C, resists 91 are selectively formed on the metal film 19, and Cu electroplating is performed in which the metal film 19 is used as a current path.

Accordingly, as shown in FIG. 7A and FIG. 7B that is a diagram of the lower face of FIG. 7A, a p-side interconnection layer 21 and a n-side interconnection layer 22 are selectively formed on the metal film 19. The p-side interconnection layer 21 and the n-side interconnection layer 22 are simultaneously formed, for example, of a copper material by using a plating method.

The p-side interconnection layer 21 is also formed inside the first openings 18a and is electrically connected to the p-side electrode 16 through the metal film 19. In addition, the n-side interconnection layer 22 is formed also inside the second openings 18b and is electrically connected to the n-side electrodes 17 through the metal film 19.

The resists 91 that are used for plating the p-side interconnection layer 21 and the n-side interconnection layer 22 are removed by using a solvent or oxygen plasma.

Figures 8A, 8B:
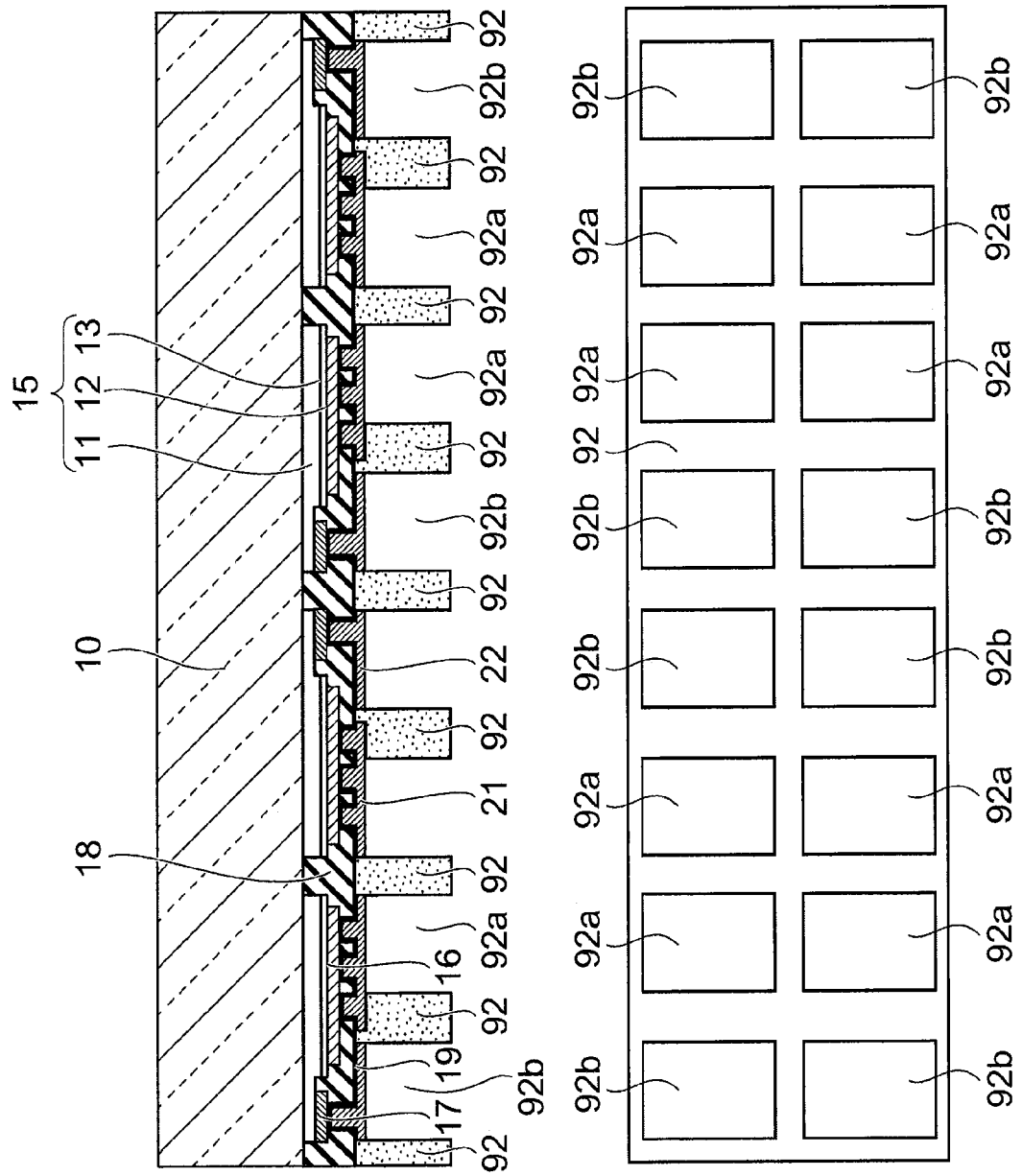

Next, as shown in FIG. 8A and FIG. 8B that is a diagram of the lower face of FIG. 8A, resists 92 used for forming metal pillars are formed. The resist 92 is thicker than the above-described resist 91. In addition, it may be configured such that the resists 91 remain without being removed in the previous process, and the resists 92 are formed so as to overlap the resists 91. In the resists 92, first openings 92a and second openings 92b are formed.

Then, Cu electroplating is performed in which the metal film 19 is used as a current path while the resists 92 are used as a mask. Accordingly, as shown in FIG. 9A and FIG. 9B that is a diagram of the lower face of FIG. 9A, a p-side metal pillar 23 and an n-side metal pillar 24 are formed.

The p-side metal pillar 23 is formed on the surface of the p-side interconnection layer 21 inside the first opening 92a that is formed in the resist 92. The n-side metal pillar 24 is formed on the surface of the n-side interconnection layer 22 inside the second opening 92b that is formed in the resist 92. The p-side metal pillar 23 and the n-side metal pillar 24 are simultaneously formed by using a plating method and, for example, are formed of a copper material.

Figure 10A:
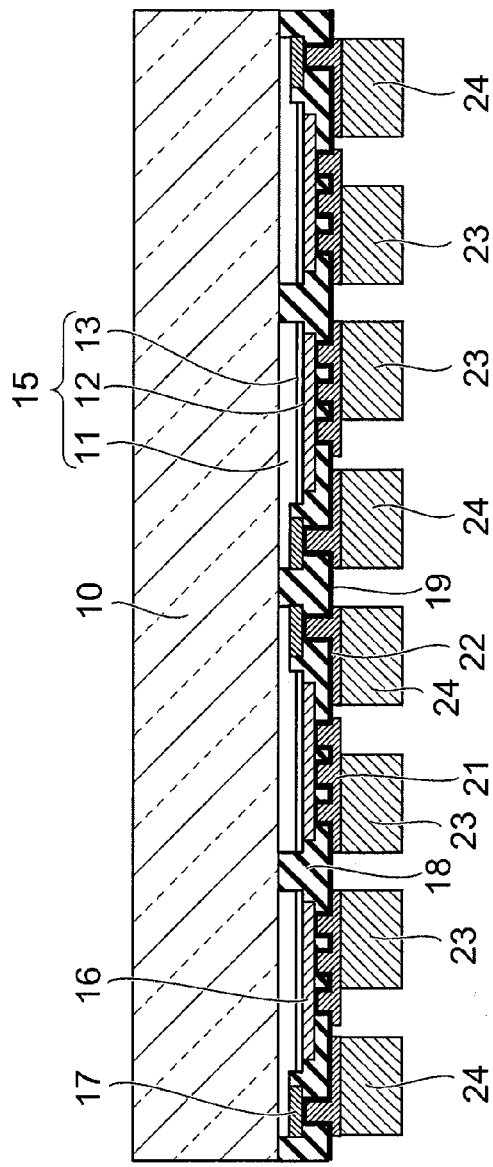
Figure 10B:
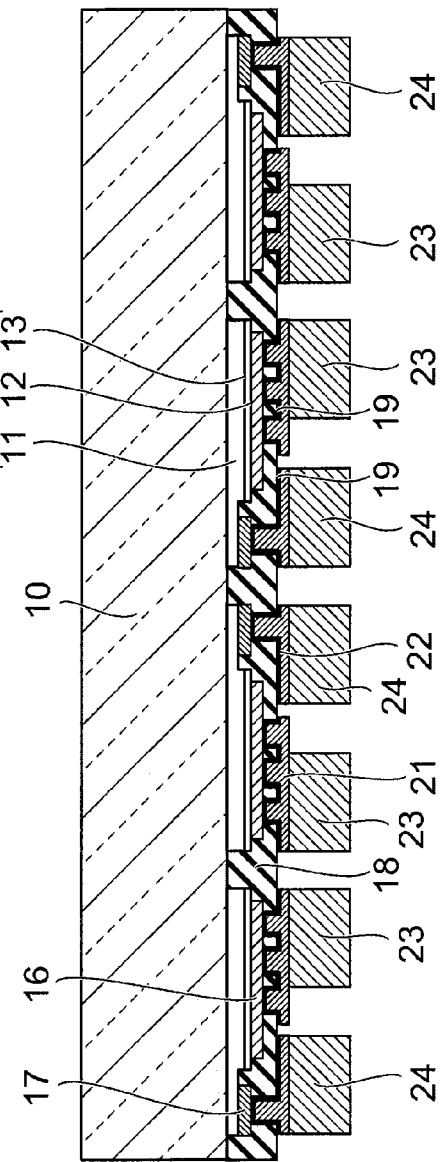

The resist 92, as shown in FIG. 10A, is removed, for example, by using a solvent or oxygen plasma. Thereafter, exposed parts of the metal film 19 are removed by wet etching while the p-side metal pillar 23, the n-side metal pillar 24, the p-side interconnection layer 21, and the n-side interconnection layer 22 are used as a mask. Accordingly, as shown in FIG. 10B, the electric connection between the p-side interconnection layer 21 and the n-side interconnection layer 22 through the metal film 19 is separated.

Next, as shown in FIG. 11A, a resin layer 25 is stacked on the insulating film 18. The resin layer 25 covers the p-side interconnection layer 21, the n-side interconnection layer 22, the p-side metal pillar 23, and the n-side metal pillar 24.

The resin layer 25 has an insulating property. In addition, for example, carbon black may be contained in the resin layer 25 so as to have a light shielding property for the emission light emitted from the light emitting layer 13.

Next, as shown in FIG. 11B, the substrate 10 is removed. In a case where the substrate 10 is a sapphire substrate, the substrate 10 can be removed, for example, by using a laser lift-off method. More specifically, laser light is emitted from the rear face side of the substrate 10 toward the first semiconductor layer 11. The laser light has transparency for the substrate 10 and has a wavelength that is included in an absorption region of the first semiconductor layer 11.

When the laser light arrives at an interface between the substrate 10 and the first semiconductor layer 11, the first semiconductor layer 11 that is located near the interface absorbs energy of the laser light so as to be decomposed. The first semiconductor layer 11 is decomposed into gallium (Ga) and nitrogen gas. According to the decomposition reaction, a minute gap is formed between the substrate 10 and the first semiconductor layer 11, whereby the substrate 10 and the first semiconductor layer 11 are separated from each other.

The emission of the laser light is performed over the whole wafer divided into a plurality of times for set areas, whereby the substrate 10 is removed.

In a case where the substrate 10 is a silicon substrate, the substrate 10 can be removed by etching.

The above-described stacked body that is formed on the principal face of the substrate 10 is reinforced by the p-side metal pillar 23 that is thicker than the semiconductor layer 15, the n-side metal pillar 24, and the resin layer 25, and accordingly, the wafer state can be maintained even when the substrate 10 disappears.

In addition, both the material of the resin layer 25 and the metal that configures the p-side metal pillar 23 and the n-side metal pillar 24 are materials that are more flexible than the material of the semiconductor layer 15. The semiconductor layer 15 is supported by the flexible support members. Accordingly, even when strong internal stress occurring when the semiconductor layer 15 is epitaxially grown on the substrate 10 is released at once when the substrate 10 is peeled off, the semiconductor layer 15 can be avoided from being destroyed.

The first face 15a of the semiconductor layer 15 from which the substrate 10 has been removed is cleaned. For example, gallium (Ga) that is attached to the first face 15a is removed by using rare hydrofluoric acid or the like.

Thereafter, wet etching is performed for the first face 15a, for example, by using a potassium hydroxide (KOH) solution, tetramethylammonium hydroxide (TMAH), or the like. Accordingly, the concavo-convex is formed on the first face 15a in accordance with a difference in the etching speed that depends on the direction of the crystal plane, as shown in FIG. 12A. Alternatively, the concavo-convex may be formed on the first face 15a by performing etching after patterning using a resist. By forming the concavo-convex on the first face 15a, the light extraction efficiency can be improved.

Next, as shown in FIG. 12B, a phosphor layer 30 is formed on the first face 15a. The phosphor layer 30 is also formed on the insulating film 18 between semiconductor layers 15 that are adjacent to each other.

After a transparent resin 31 of a liquid phase in which phosphor 32 are dispersed is supplied to the upper side of the first face 15a, for example, by using a method such as a printing method, a potting method, a molding method, or a compression molding, the transparent resin 31 is thermally cured.

In addition, a transparent film 35 is formed on the top face of the phosphor layer 30. In a case where the transparent film 35 is an inorganic film such as a silicon oxide film, a silicon nitride film, or a silicon oxynitride film, the transparent film 35 can be formed, for example, by using a CVD method. In a case where the transparent film 35 is formed from a resin material, the transparent film 35 can be formed by supplying a resin of a liquid phase to the upper side of the phosphor layer 30 and then curing the resin. Alternatively, the transparent film 35 having a film shape may be bonded to the upper side of the phosphor layer 30.

Figures 13A, 13B:
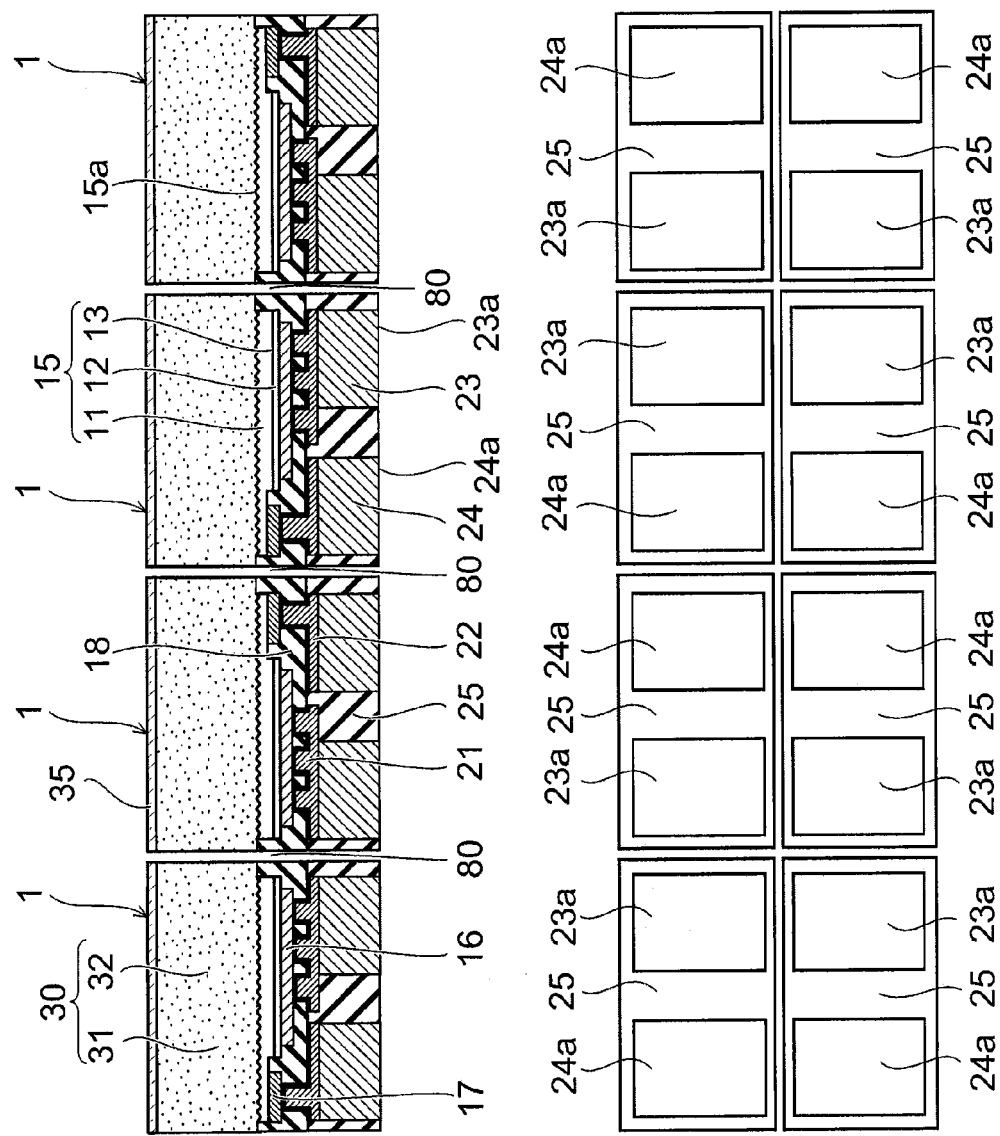

Next, the surface (the lower face in FIG. 12B) of the resin layer 25 is ground such that, as shown in FIG. 13A and FIG. 13B that is a diagram of the lower face of FIG. 13A, the p-side external terminals 23a and the n-side external terminals 24a are exposed.

Thereafter, at the position of the above-described groove 80, the transparent film 35, the phosphor layer 30, the insulating film 18, and the resin layer 25 are cut so as to be individualized into a plurality of semiconductor light emitting devices 1. For example, the cutting is performed by using a dicing blade. Alternatively, the cutting may be performed by laser radiation.

When the dicing is performed, the substrate 10 has been already removed. In addition, since the semiconductor layer 15 is not present in the groove 80, a damage received by the semiconductor layer 15 when the dicing is performed can be avoided. In addition, a configuration can be acquired without any additional process after the individualization into the plurality of semiconductor light emitting devices 1, in which the end portion (side surface) of the semiconductor layer 15 is covered with the insulating film 18 for protection.

In addition, the individualized semiconductor light emitting device 1 may have a single chip configuration that includes one semiconductor layer 15 or a multiple-chip configuration that includes a plurality of semiconductor layers 15.

Since the above-described processes before dicing are performed altogether in the wafer state, it is not necessary to perform interconnection and packaging for each individualized device, and the production cost can be significantly reduced. In other words, in the individualized state, the interconnection and the packaging are completed. Accordingly, the productivity can increase, and, as a result, the price can be lowered in an easy manner.

Each semiconductor light emitting device 1, as shown in FIG. 14A, is cut out from the resin layer 25 side in a state in which the transparent film 35 is attached to the cover tape 85.

Figure 14B:
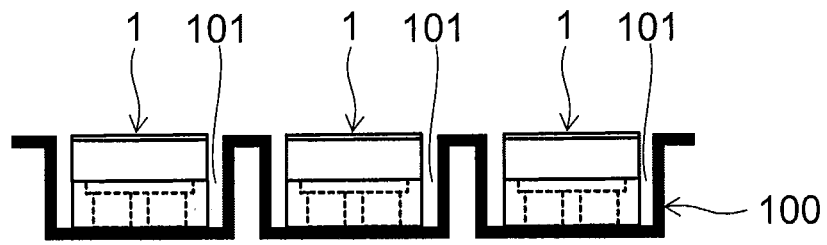

Then, each individualized semiconductor light emitting device 1 is peeled off from the cover tape 85 and, as shown in FIG. 14B, is housed inside a concave portion 101 of the case 100 in a state in which the resin layer 25 and the metal pillars 23 and 24 face the lower side.

According to the embodiment, the semiconductor light emitting devices 1 are attached to the cover tape 85 through the transparent film 35 of which the adhesiveness is lower than that of the transparent resin 31 of the phosphor layer 30. Accordingly, the semiconductor light emitting devices 1 can be easily peeled off from the cover tape 85 without damaging the phosphor layer 30. In other words, according to the embodiment, the handling characteristics of the semiconductor light emitting devices 1 after the individualization can be improved.

In addition, the transparent film 35, as shown in FIG. 15A, may be provided on the side surface (the side surface of the phosphor layer 30, the side surface of the insulating film 18, and the side of the resin layer 25) of the semiconductor light emitting device.

By dicing the semiconductor light emitting devices without forming the transparent film 35 on the phosphor layer 30 and forming the transparent film 35 on the top face and the side surface of each individualized semiconductor light emitting device, for example, by using a spray coating method, the configuration shown in FIG. 15A can be acquired.

By providing the transparent film 35 having low adhesiveness also on the side surface of the semiconductor light emitting device, even when the side surface of the semiconductor light emitting device is in contact with the side wall of the concave portion 101 in a state in which the semiconductor light emitting device is housed inside the concave portion 101 of the case 100 as shown in FIG. 14B, the side surface of the semiconductor light emitting device can be easily separated from the side wall of the concave portion 101, and accordingly, the acquisition of the semiconductor light emitting device from the case 100 is not disturbed.

In addition, a lens 36 may be provided on the first face 15a as in a semiconductor light emitting device 2 shown in FIGS. 16A to 16C and 17. The shape of the lens 36 is not limited to a concave shape but may be a convex shape.

Figure 16A:
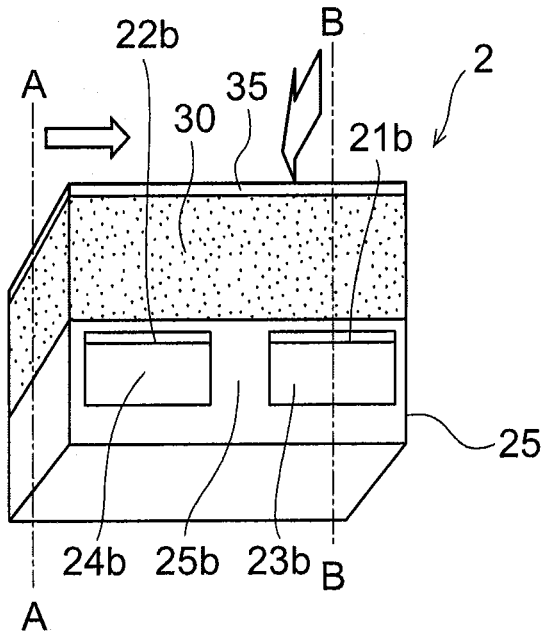
FIGS. 16A to 16C are schematic views of a light emitting device of still another specific example of the first embodiment.
Figure 16B:
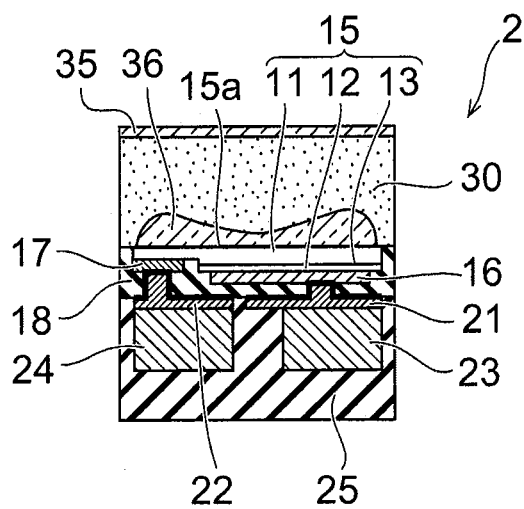
Figure 16C:
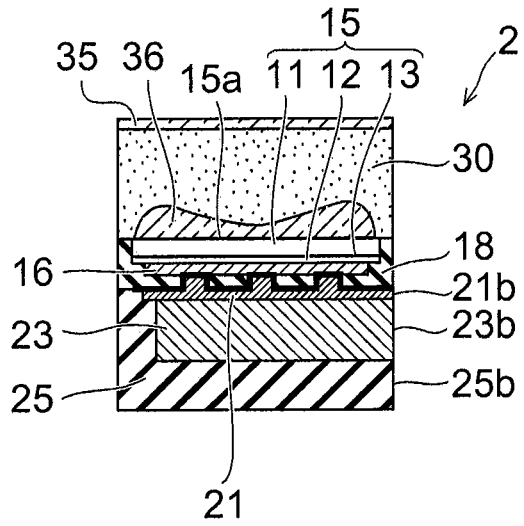

FIG. 16A is a schematic perspective view of a semiconductor light emitting device 2 of a variation of the first embodiment. FIG. 16B is a cross-sectional view taken along line A-A shown in FIG. 16A. FIG. 16C is a cross-sectional view taken along line B-B shown in FIG. 16A.

Figure 17:
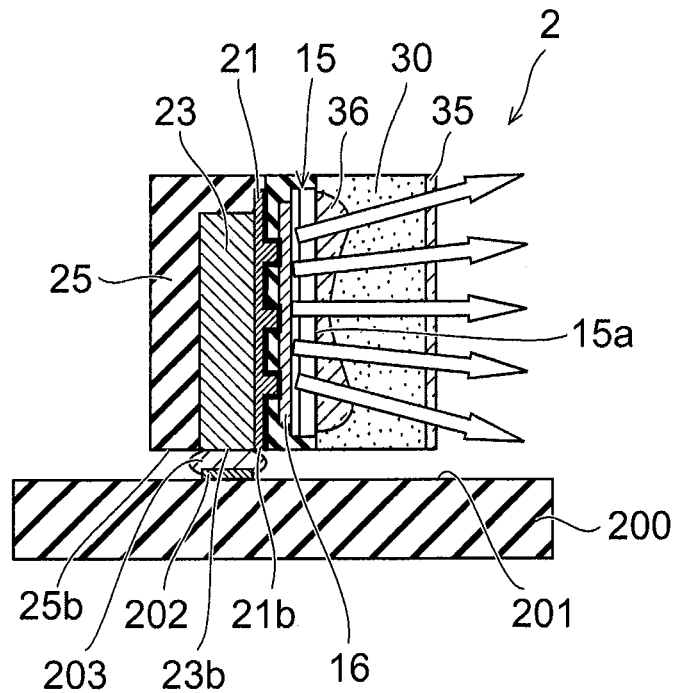
FIG. 17 is a schematic cross-sectional view of the semiconductor light emitting device shown in FIG. 16 mounted on a mount substrate.

FIG. 17 is a schematic cross-sectional view of a light emitting module that has a configuration in which the semiconductor light emitting device 2 is mounted on a mounting substrate 200.

As shown in FIGS. 16A and 16C, a part of the side surface of the p-side metal pillar 23 is exposed from the resin layer 25 on a third face 25b that has a plane direction different from the first face 15a and the second face of the semiconductor layer 15. The exposed face serves as a p-side external terminal 23b that is used for mounting the semiconductor light emitting device on an external mounting substrate.

The third face 25b is a face that is approximately perpendicular to the first face 15a and the second face of the semiconductor layer 15. The resin layer 25, for example, has four side surfaces of a rectangular shape, and one side surface of the four side surfaces is the third face 25b.

On such a third face 25b, a part of the side surface of the n-side metal pillar 24 is exposed from the resin layer 25. The exposed face serves as an n-side external terminal 24b that is used for mounting the semiconductor light emitting device on the external mounting substrate.

In addition, as shown in FIG. 16A, a part of the side surface 21b of the p-side interconnection layer 21 is also exposed from the resin layer 25 on the third face 25b and serves as a p-side external terminal. Similarly, a part of the side surface 22b of the n-side interconnection layer 22 is also exposed from the resin layer 25 on the third face 25b and serves as an n-side external terminal.

Parts of the p-side metal pillar 23 other than the p-side external terminal 23b that is exposed on the third face 25b is covered with the resin layer 25. In addition, parts of the n-side metal pillar 24 other than the n-side external terminal 24b that is exposed on the third face 25b is covered with the resin layer 25.

In addition, parts of the p-side interconnection layer 21 other than the side surface 21b that is exposed on the third face 25b is covered with the resin layer 25. In addition, parts of the n-side interconnection layer 22 other than the side surface 22b that is exposed on the third face 25b is covered with the resin layer 25.

The semiconductor light emitting device 2, as shown in FIG. 17, is mounted in a posture in which the third face 25b faces the mounting face 201 of the mounting substrate 200. The p-side external terminal 23b and the n-side external terminal 24b that are exposed on the third face 25b are bonded to the pad 202 that is formed on the mounting face 201 through soldering 203. In addition, a interconnection pattern is formed on the mounting face 201 of the mounting substrate 200, and the pad 202 is connected to the interconnection pattern.

The third face 25b is approximately perpendicular to the first face 15a that is the principal light emitting face. Accordingly, in the posture in which the third face 25b faces the mounting face 201 side that is disposed on the lower side, the first face 15a faces not the upper side of the mounting face 201 but in the horizontal direction. In addition, the semiconductor light emitting device 2 is a semiconductor light emitting device of a so-called side view type in which light is emitted in the horizontal direction in a case where the mounting face 201 is set as the horizontal plane.

Also in the semiconductor light emitting device 2 of the side view type, by providing the transparent film 35 having low adhesiveness on the phosphor layer 30, the semiconductor light emitting device 2 can be easily peeled off from the cover tape 85, and accordingly, the handling characteristics can be improved.

Second Embodiment

Figure 18:
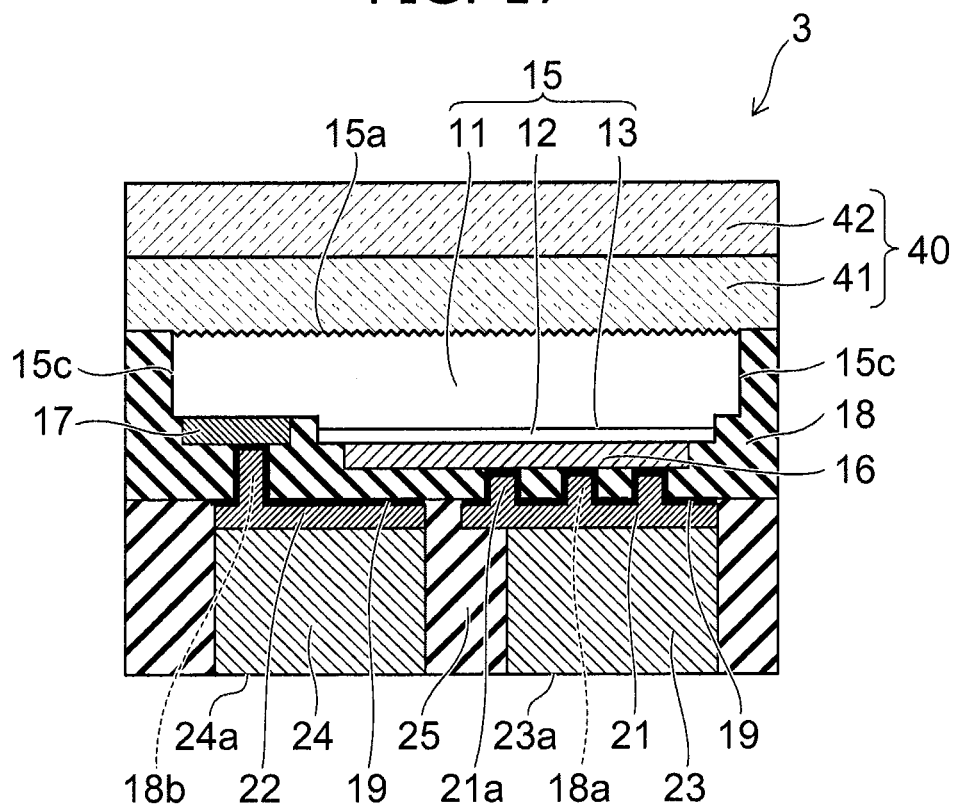
FIG. 18 is a schematic cross-sectional view of a light emitting device of a second embodiment.

FIG. 18 is a schematic cross-sectional view of a semiconductor light emitting device 3 according to a second embodiment.

In the semiconductor light emitting device 3 according to the second embodiment, the configuration on a first face 15a is different from that of the semiconductor light emitting device 1 according to the first embodiment. The configuration of a side opposite to the first face 15a is the same as that of the first embodiment, which includes the semiconductor layer 15, the p-side electrode 16, the n-side electrode 17, the insulating film 18, the p-side interconnection layer 21, the n-side interconnection layer 22, the p-side metal pillar 23, the n-side metal pillar 24, and the resin layer 25.

According to the semiconductor light emitting device 3 of the second embodiment, a transparent stacked film 40 is provided on the first face 15a. The transparent stacked film 40 does not include phosphor and has transparency for emission light emitted from the light emitting layer 13.

The semiconductor layer 15 contains gallium nitride. The transparent stacked film 40 has a refractive index that is between the refractive index (about 2.4) of gallium nitride and the refractive index (1.0) of the air.

The transparent stacked film 40 includes an organic film 41 that is provided so as to be in contact with the first face 15a and one or more layers of a transparent film 42 that is provided on the organic film 41 and has a refractive index that is less than the organic film 41.

The organic film 41 is a compound that contains carbon and has transparency for emission light emitted from the light emitting layer 13. The refractive index of the organic film 41 is lower than that of the gallium nitride and is higher than that of the air. As the material of the organic film 41, for example, a thermoplastic resin such as an epoxy resin that has a refractive index in the range of 1.50 to 1.65 or a melamine resin that has a refractive index in the range of 1.60 to 1.75 may be used. In addition, as the material of the organic film 41, a hybrid material in which an epoxy resin and a silicone resin are mixed may be also used.

The concavo-convex of the first face 15a is covered with the organic film 41, and the top face of the organic film 41 is flat. According to the organic film 41, compared to an inorganic film, the flatness can be easily acquired, and the optical design, the handling characteristics, and the mounting of the organic film 41 can be easily performed.

In addition, the transparent film 42 provided on the organic film 41 also has transparency for the emission light emitted from the light emitting layer 13. The refractive index of the transparent film 42 is lower than that of the organic film 41 and is higher than the refractive index of the air. As the material of the transparent film 42, for example, a silicone resin having a refractive index in the range of 1.45 to 1.60, a polycarbonate resin having a refractive index in the range of 1.40 to 1.60, or the like can be used. Alternatively, as the material of the transparent film 42, a silicon oxide film or a silicon nitride film that can be formed by using the CVD method or the sputtering method may be used.

Although only one layer of the transparent film 42 is represented in FIG. 18, a plurality of the transparent films 42 may be provided. In such a case, the plurality of the transparent films 42 are formed such that the refractive index of a transparent film is higher as the film is provided on a further organic film 41 side, and the refractive index of a transparent film is lower as the film is provided on a further air layer side.

According to the second embodiment, a transparent stacked film 40 is provided on the first face 15a containing gallium nitride, which is a stacked film of a plurality of films having refractive indices that are between the refractive indices of gallium nitride and the air and each having a higher refractive index as the film is disposed on a further first face 15a side and having a lower refractive index as the film is disposed on a further air layer side. Accordingly, the refractive index of the medium is prevented from greatly changing in the light extracting direction through the first face 15a, whereby the light extracting efficiency can be improved.

In addition, also in the semiconductor light emitting device 3 according to the second embodiment, the connection configuration is not limited to a plurality of vias 21a. Thus, as shown in FIG. 15B, the p-side interconnection layer 21 may be connected to the p-side electrode 16 through one post 21c having a planar size that is larger than the via 21a. In such a case, the heat dissipation of the light emitting layer 13 can be improved through the p-side electrode 16, the p-side interconnection layer 21, and the p-side metal pillar 23, all of which are formed of metal.

Furthermore, the semiconductor light emitting device 3 according to the second embodiment may be also configured as a semiconductor light emitting device of the side view type in which not the lower face but the side surface of the p-side metal pillar 23 is exposed so as to be configured as a p-side external terminal, and not the lower face but the side surface of the n-side metal pillar 24 is exposed so as to be configured as an n-side external terminal.

Figure 19A:
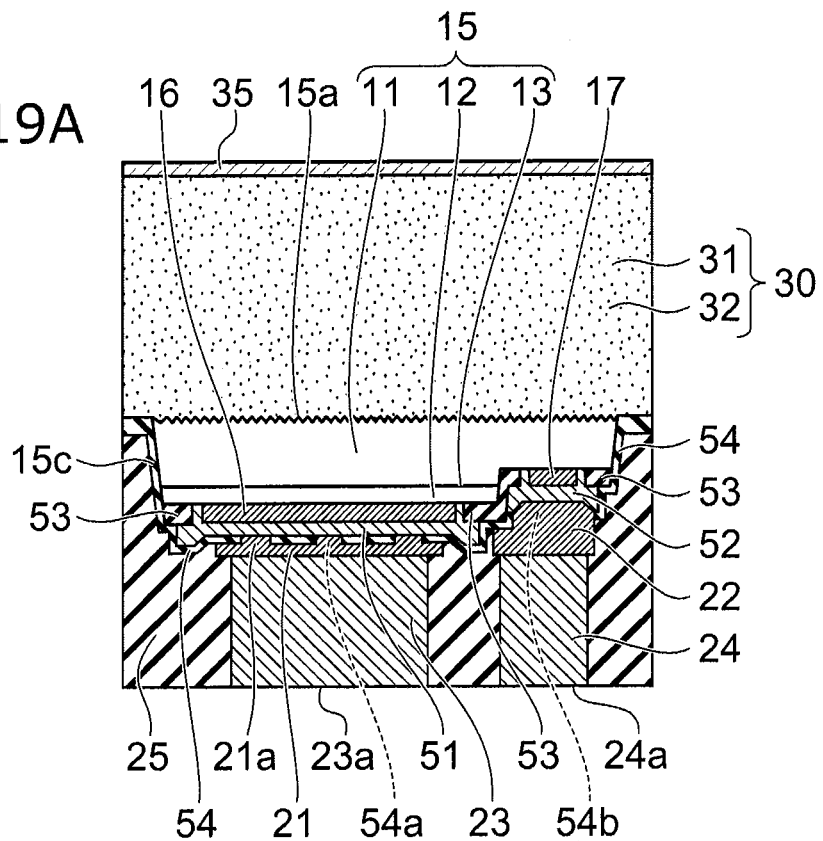
FIG. 19A is a schematic cross-sectional view of a light emitting device of another specific example of the first embodiment.

FIG. 19A is a schematic cross-sectional view that shows a variation of the semiconductor light emitting device according to the first embodiment.

In the semiconductor light emitting device shown in FIG. 19A, a p-side pad 51 with which the p-side electrode 16 is covered on the surface and the side surface of the p-side electrode 16 is provided. The p-side electrode 16, for example, contains at least one of nickel (Ni), gold (Au), and rhodium (Rh) that can form an alloy together with gallium (Ga) that is contained in the semiconductor layer 15. The p-side pad 51 has reflectance for the emission light, which is emitted from the light emitting layer 13, that is higher than the p-side electrode 16 and, for example, contains silver (Ag) as its main ingredient. In addition, the p-side pad 51 protects the p-side electrode 16 from oxidation or corrosion.

In addition, an n-side pad 52 with which the n-side electrode 17 is covered on the surface and the side surface of the n-side electrode 17 is provided. The n-side electrode 17, for example, contains at least one of nickel (Ni), gold (Au), and rhodium (Rh) that can form an alloy together with gallium (Ga) that is contained in the semiconductor layer 15. The n-side pad 52 has reflectance for the emission light, which is emitted from the light emitting layer 13, that is higher than the n-side electrode 17 and, for example, contains silver (Ag) as its main ingredient. In addition, the n-side pad 52 protects the n-side electrode 17 from oxidation or corrosion.

On the periphery of the p-side electrode 16 and the periphery of the n-side electrode 17 on the second face of the semiconductor layer 15, for example, an insulating film 53, for example, that is formed from a silicon oxide film, a silicon nitride film, or the like is provided. The insulating film 53 is provided between the p-side electrode 16 and the n-side electrode 17 and between the p-side pad 51 and the n-side pad 52.

On the insulating film 53, the p-side pad 51, and the n-side pad 52, an insulating film 54 such as a silicon oxide film, a silicon nitride film, or the like is provided. In addition, the insulating film 54 is provided also on the side surface 15c of the semiconductor layer 15 and covers the side surface 15c.

On the insulating film 54, a p-side interconnection layer 21 and an n-side interconnection layer 22 are provided. The p-side interconnection layer 21 is connected to the p-side pad 51 through the first opening 54a that is formed in the insulating film 54. The n-side interconnection layer 22 is connected to the n-side pad 52 through the second opening 54b that is formed in the insulating film 54.

Also in the configuration, the p-side interconnection layer 21, as shown in the diagram, may be connected to the p-side pad 51 through a plurality of vias 21a or may be connected to the p-side pad 51 through one post that has planar size larger than the via 21a.

The p-side metal pillar 23 that is thicker than the p-side interconnection layer 21 is provided on the p-side interconnection layer 21. The n-side metal pillar 24 that is thicker than the n-side interconnection layer 22 is provided on the n-side interconnection layer 22.

The resin layer 25 is stacked on the insulating film 54. The resin layer 25 covers the p-side interconnection part that includes the p-side interconnection layer 21 and the p-side metal pillar 23 and the n-side interconnection part that includes the n-side interconnection layer 22 and the n-side metal pillar 24. However, a face (a lower face in the diagram) of the p-side metal pillar 23 that is disposed on a side opposite to the p-side interconnection layer 21 is exposed from the resin layer 25 so as to serve as the p-side external terminal 23a. Similarly, a face (a lower face in the diagram) of the n-side metal pillar 24 that is disposed on a side opposite to the n-side interconnection layer 22 is exposed from the resin layer 25 so as to serve as the n-side external terminal 24a.

Alternatively, the side surface of the p-side metal pillar 23 and the side surface of the n-side metal pillar 24 may be exposed so as to be configured as a semiconductor light emitting device of the side view type.

The resin layer 25 is filled inside the above-described groove 80 that separates the semiconductor layer 15 into multiple parts on the substrate 10 through the insulating film 54. Accordingly, the side surface 15c of the semiconductor layer 15 is covered with the insulating film 54 that is an inorganic film and the resin layer 25 for protection.

Figure 19B:
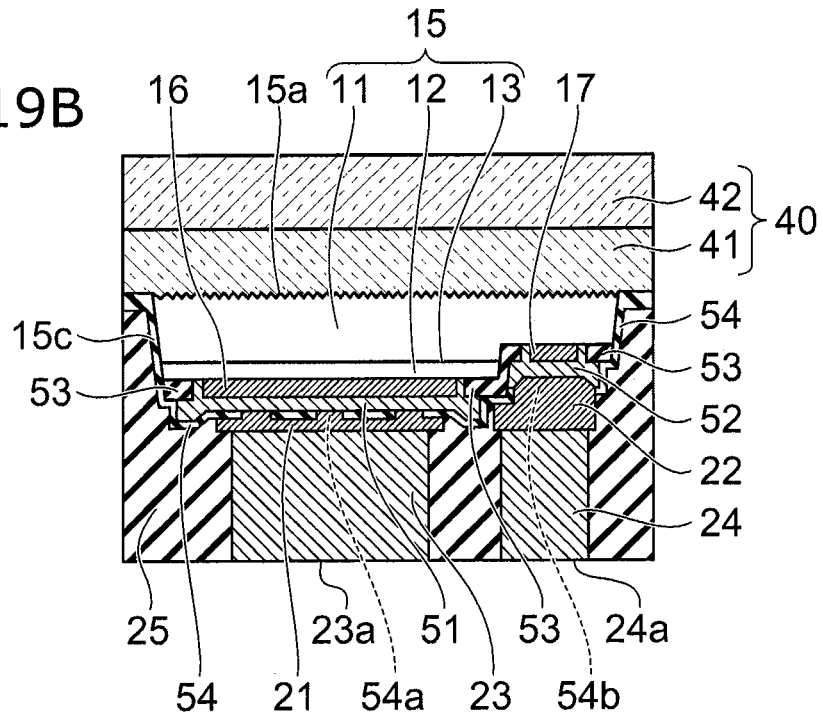
FIG. 19B is a schematic cross-sectional view of a light emitting device of another specific example of the second embodiment.

In the configuration shown below the first face 15a, which is shown in FIG. 19A, the transparent stacked film 40 may be provided, as shown in FIG. 19B, on the first face 15a. The configuration and the function of the transparent stacked film 40 are the same as those of the second embodiment.

In addition, in the above-described embodiment, the p-side interconnection layer 21 and the n-side interconnection layer 22 may be bonded to the pad of the mounting substrate without providing the p-side metal pillar 23 and the n-side metal pillar 24.

Furthermore, the p-side interconnection layer 21 and the p-side metal pillar 23 are not limited to be configured as members separated from each other, and the p-side interconnection part may be configured by providing the p-side interconnection layer 21 and the p-side metal pillar 23 so as to be integrated together in the same process. Similarly, the n-side interconnection layer 22 and the n-side metal pillar 24 are not limited to be configured as members separated from each other, and the n-side interconnection part may be configured by providing the n-side interconnection layer 22 and the n-side metal pillar 24 so as to be integrated together in the same process.

Figure 20A:
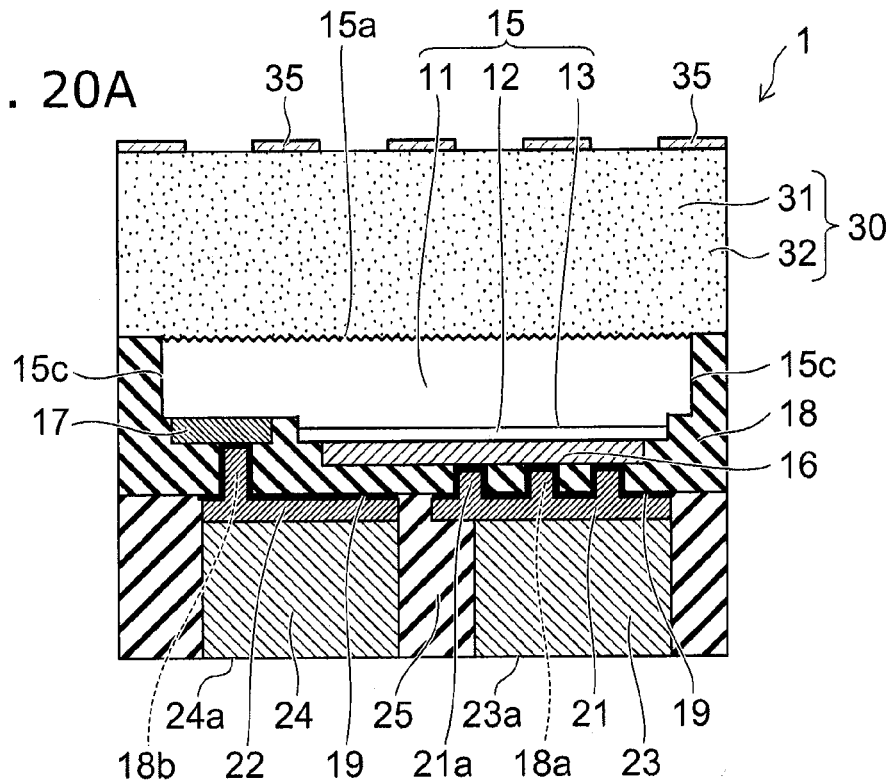
FIGS. 20A and 20B are schematic cross-sectional views of a light emitting device of still another specific example of the first embodiment.
Figure 20B:
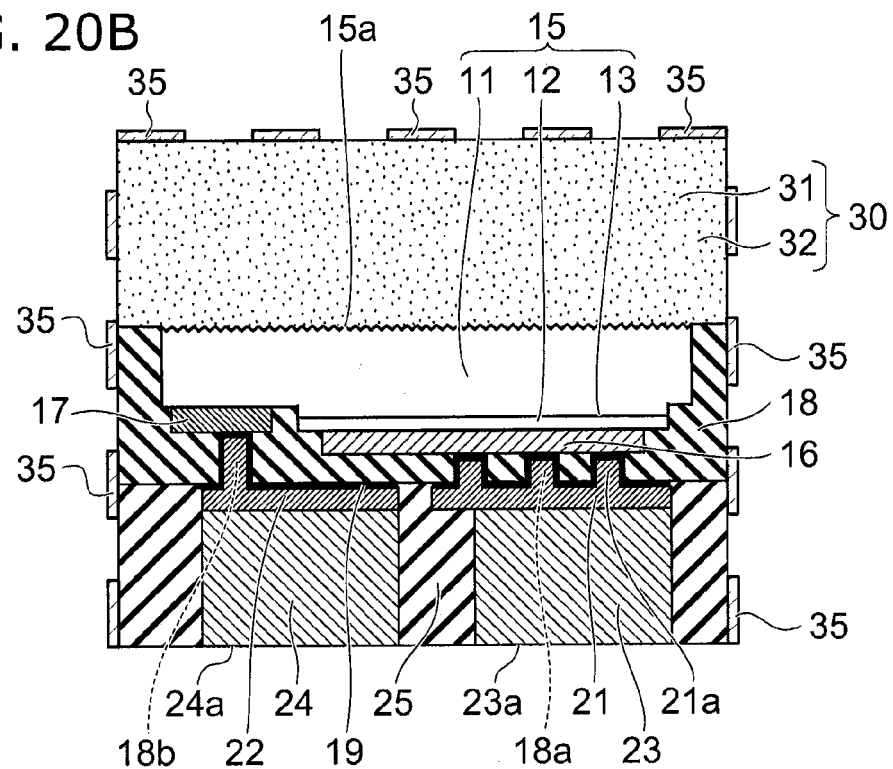

In the semiconductor light emitting device 1 according to the first embodiment, the transparent film 35 is not limited to be formed as a film that is continuous to the top face of the phosphor layer 30. Thus, as shown in FIG. 20A, even in a case where the transparent film 35 is formed in an island shape or is partially formed, the transparent film 35 having low adhesiveness is present on the phosphor layer 30, and accordingly, the semiconductor light emitting device 1 can be easily peeled off from the cover tape 85, whereby the handling characteristics can be improved. In addition, the transparent film 35 that is formed on the side surface of the semiconductor light emitting device, as shown in FIG. 20B, may be formed in an island shape or be partially formed.

Third Embodiment

Figure 21A:
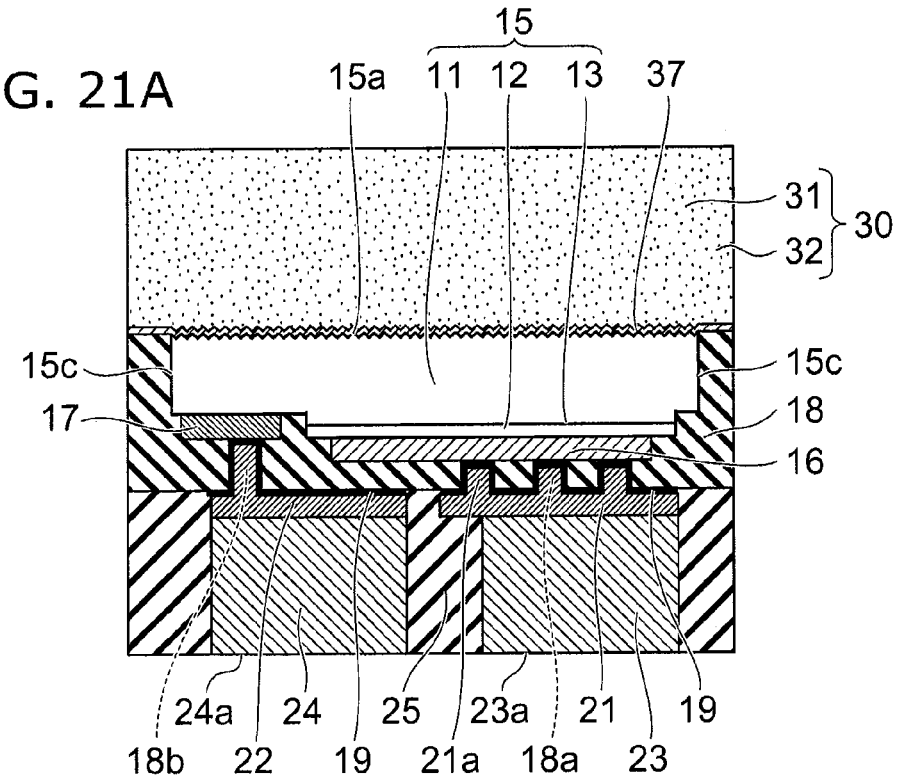
FIGS. 21A and 21B are schematic cross-sectional views of a light emitting device of a third embodiment.

FIG. 21A is a schematic cross-sectional view of a semiconductor light emitting device according to a third embodiment.

The semiconductor light emitting device according to the third embodiment includes an adhesion layer 37 that is provided between the first face 15a of the semiconductor layer 15 and the phosphor layer 30. The adhesion layer 37 does not include phosphor and has transparency for the emission light emitted from the light emitting layer 13.

The adhesion layer 37 is formed to be conformal along the concavo-convex of the first face 15a and is thinner than the phosphor layer 30. Also on the top face of the adhesion layer 37, concavo-convex on which the concavo-convex of the first face 15a is reflected is formed. The phosphor layer 30 is provided on the concavo-convex face of the adhesion layer 37.

The adhesion layer 37, for example, at least includes one of a silicon oxide film ($SiO_2$ film), a silicon nitride film (SiN film), a glass film (spin on glass (SOG) film) that is formed by the spin coating method, a silicon oxynitride film (SiON film), a carbon silicon film (SiC film), and a carbon-containing silicon oxide film (SiOC film).

The adhesion of the adhesion layer 37 for the phosphor layer 30 is higher than the semiconductor layer 15. In other words, a force that is required for peeling off the phosphor layer 30 bonded to the adhesion layer 37 from the adhesion layer 37 is larger than a force that is required for peeling off the phosphor layer 30 bonded to the semiconductor layer 15 from the semiconductor layer 15. Accordingly, the peel-off of the phosphor layer 30 from the semiconductor layer 15 is prevented, whereby the reliability can be improved.

Figure 28:
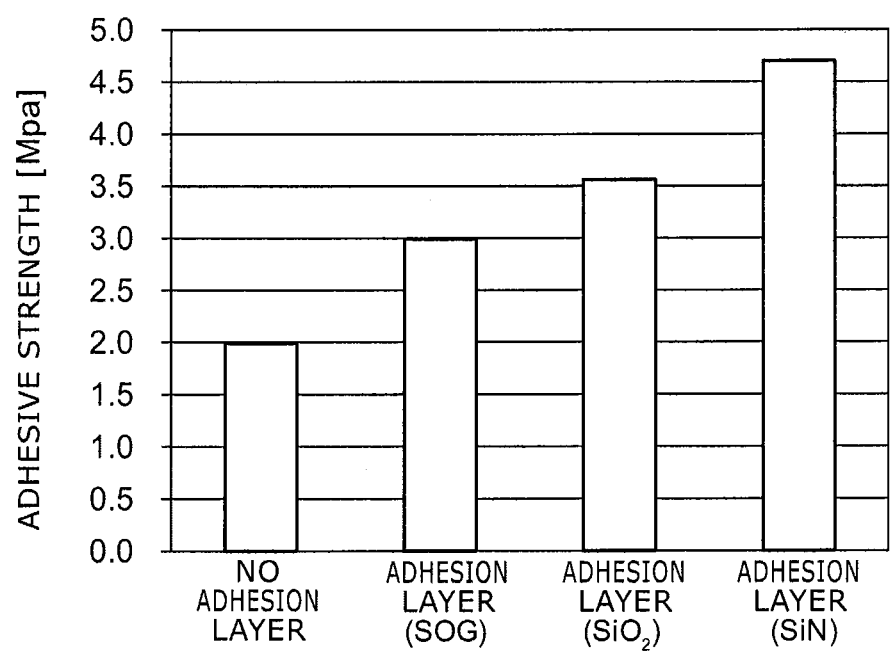
FIG. 28 is a graph that compares an adhesive strength of an adhesion layer.

FIG. 28 is a graph that compares the adhesive strength (MPa) of the phosphor layer 30 based on the presence/absence of the adhesion layer 37 and the material of the adhesion layer 37. The adhesive strength is a value that is acquired by a stud pull method (tensile test).

Here, no-adhesion layer shows a configuration in which the phosphor layer 30 is directly provided on the first face 15a without providing the adhesion layer 37. In such a case, the adhesive strength of the phosphor layer 30 for the first face 15a is about 2.0 (MPa).

In a case where a SOG film is provided as the adhesion layer 37, the adhesive strength of the phosphor layer 30 is about 3.0 (MPs). In a case where a $SiO_2$ film is provided as the adhesion layer 37, the adhesive strength of the phosphor layer 30 is about 3.5 (MPs). In addition, in a case where a SiN film is provided as the adhesion layer 37, the adhesive strength of the phosphor layer 30 is about 4.7 (MPs).

Based on the graph shown in FIG. 28, it can be understood that the adhesive strength of the phosphor layer 30 can be configured to be higher in a configuration in which the adhesion layer 37 is provided than in a configuration in which the adhesion layer 37 is not provided. In addition, regarding the material of the adhesion layer 30, the adhesive strength of the $SiO_2$ film to the phosphor layer 30 is higher than that of the SOG film, and the adhesive strength of the SiN film to the phosphor layer 30 is higher than that of the $SiO_2$ film.

In addition, the adhesion layer 37 having a refractive index that is between the refractive indices of gallium nitride and the air is provided on the first face 15a that contains gallium nitride. Accordingly, the refractive index of the medium is prevented from greatly changing in the light extracting direction through the first face 15a, whereby the light extracting efficiency can be improved.

Figure 23A:
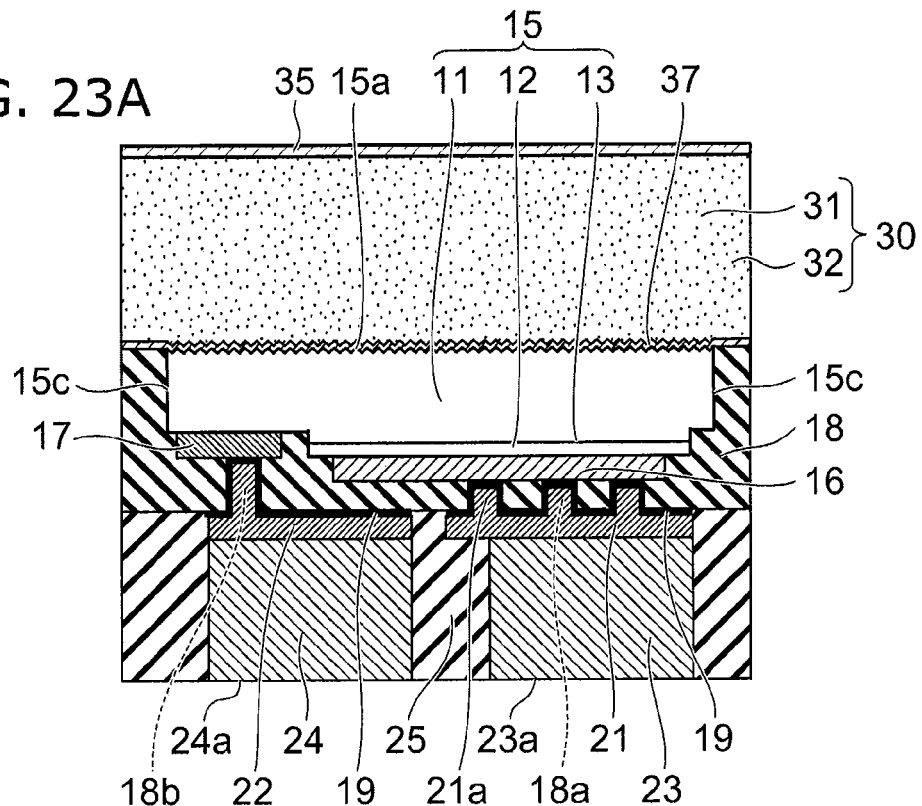
FIGS. 23A and 23B are schematic cross-sectional views of a light emitting device of still another specific example of the third embodiment.

FIG. 23A shows a configuration in which the adhesion layer 37 is provided between the first face 15a and the phosphor layer 30 in the configuration, in which the above-described transparent film 35 is provided on the top face of the phosphor layer 30, shown in FIG. 1.

Figure 23B:
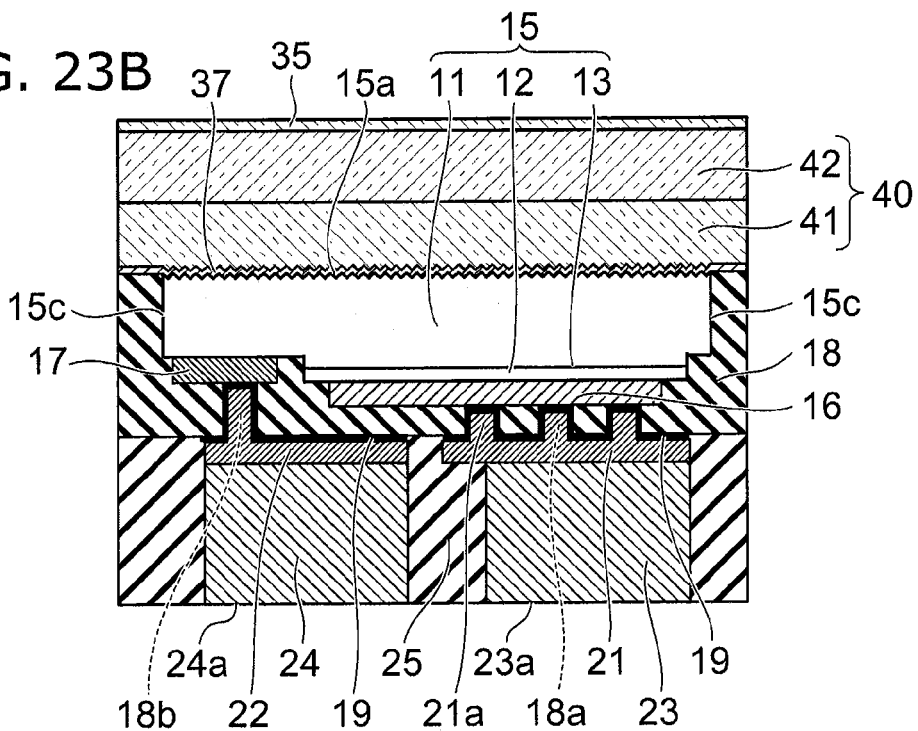

A transparent body, which is disposed on the first face 15a, that is a target for increasing the adhesiveness for the semiconductor layer 15 using the adhesion layer 37 is not limited to the phosphor layer 30, but, as shown in FIG. 23B, the above-described transparent stacked film 40 according to the second embodiment may be used.

In other words, the adhesion layer 37 is provided between the first face 15a and the organic film 41 of the transparent stacked film 40 and has adhesive strength to the organic film 41 higher than that to the semiconductor layer 15.

In other words, a force that is required for peeling off the organic film 41 bonded to the adhesion layer 37 from the adhesion layer 37 is larger than a force that is required for peeling off the organic film 41 bonded to the semiconductor layer 15 from the semiconductor layer 15. Accordingly, the peel-off of the organic film 41 and the transparent stacked film 40 from the semiconductor layer 15 is prevented, whereby the reliability can be improved.

In addition, in the semiconductor light emitting device shown in FIG. 23B, the transparent film 35 is provided on the top face of the transparent film 42 of the transparent stacked film 40.

The adhesiveness (tackiness) of the transparent film 35 is lower than that of the transparent film 42. Accordingly, a force that is required for peeling off the cover tape 85, which is shown in FIG. 14A, attached to the transparent film 35 from the transparent film 35 at a constant speed is smaller than a force that is required for peeling off the cover tape 85 that is attached to the transparent film 42 from the transparent film 42 at the constant speed.

In other words, the semiconductor light emitting device shown in FIG. 23B is attached to the cover tape 85 through the transparent film 35 having adhesiveness lower than the transparent film 42. Accordingly, the semiconductor light emitting device can be easily peeled off from the cover tape 85 without damaging the transparent stacked film 40, and therefore, the handling characteristics of the semiconductor light emitting devices after individualization can be improved.

Figure 21B:
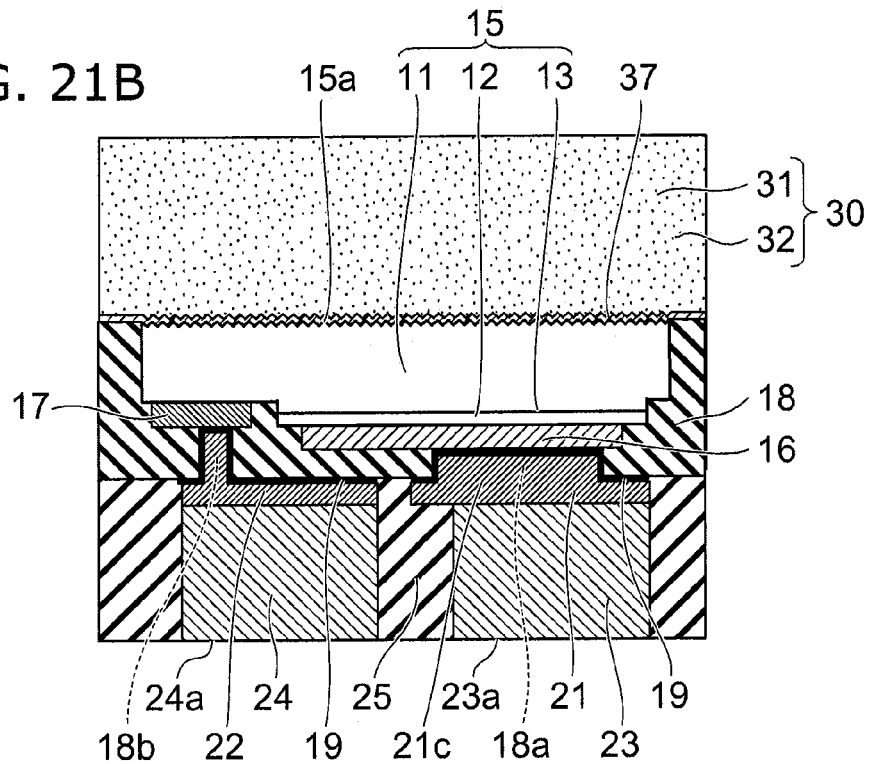

FIG. 24A shows a configuration in which the adhesion layer 37 is provided between the first face 15a and the phosphor layer 30 under the configuration shown in FIG. 15A. FIG. 24B shows a configuration in which the adhesion layer 37 is provided between the first face 15a and the phosphor layer 30 under the configuration shown in FIG. 15B. In the configuration shown in FIG. 24B, as shown in FIG. 21B, the transparent film 35 disposed on the phosphor layer 30 may not be provided.

Figure 22A:
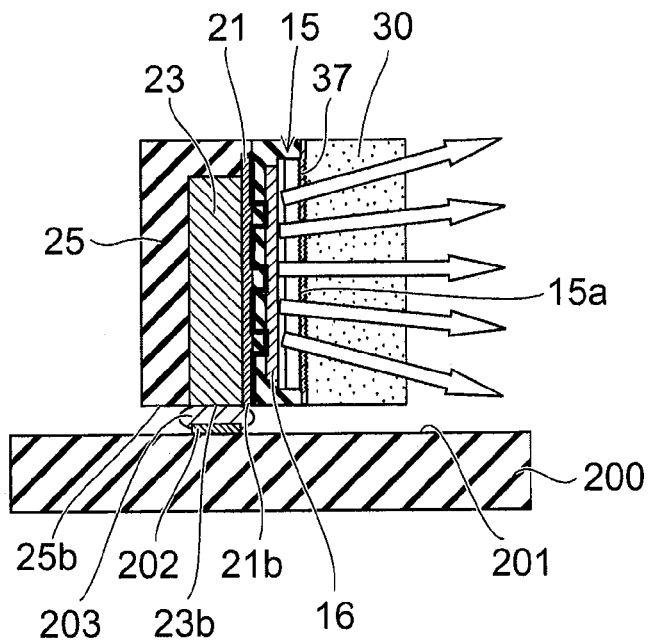
FIGS. 22A and 22B are schematic cross-sectional views of a light emitting device of another specific example of the third embodiment.
Figure 25:
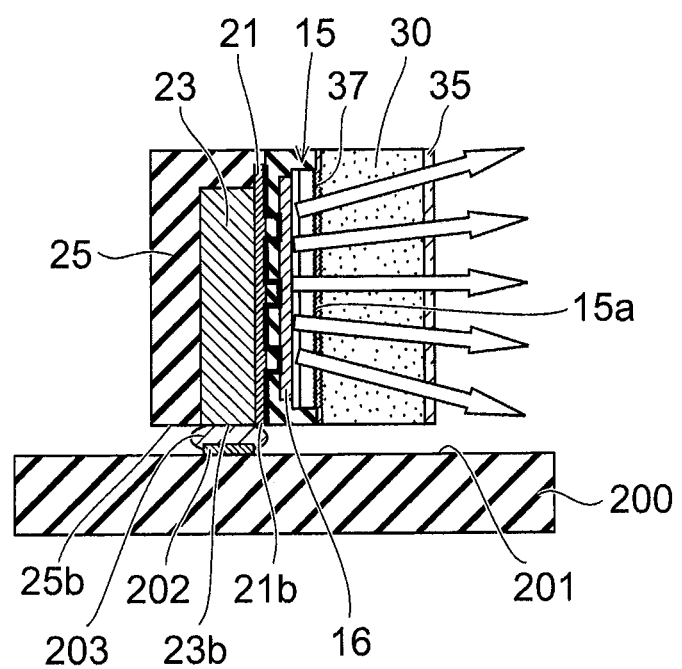

FIG. 25 shows a configuration in which the adhesion layer 37 is provided between the first face 15a and the phosphor layer 30 under the configuration of the side view type shown in FIG. 17. In addition, in the configuration shown in FIG. 25, although the lens 36 shown in FIG. 17 is not provided, the lens 36 may be provided on the adhesion layer 37. In the configuration shown in FIG. 25, as shown in FIG. 22A, the transparent film 35 disposed on a face of the phosphor layer 30 that is opposite to the first face 15a may not be provided.

Figure 22B:
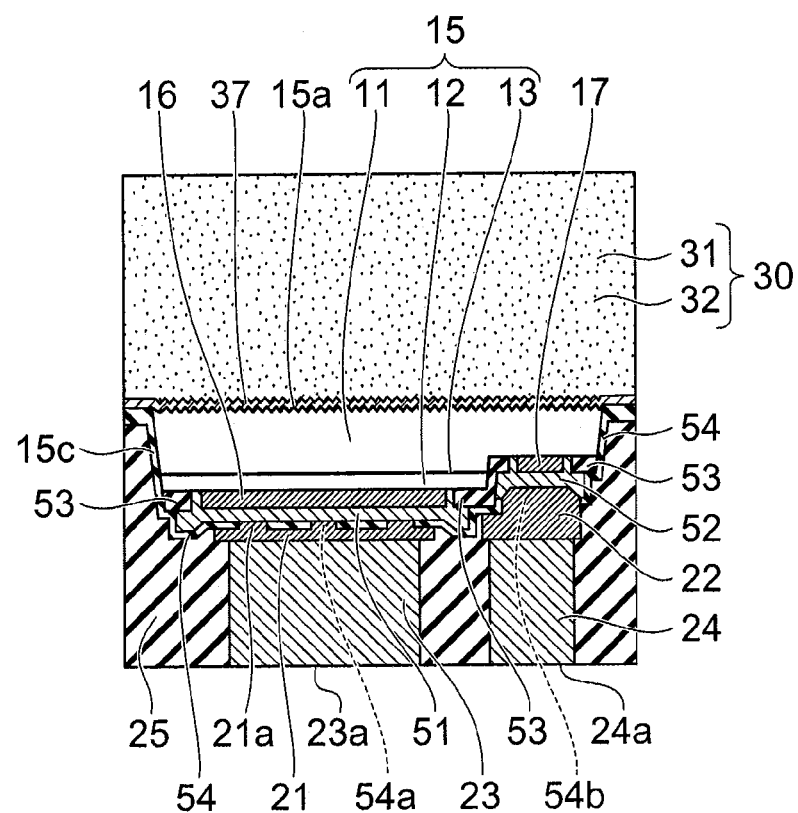
Figure 26A:
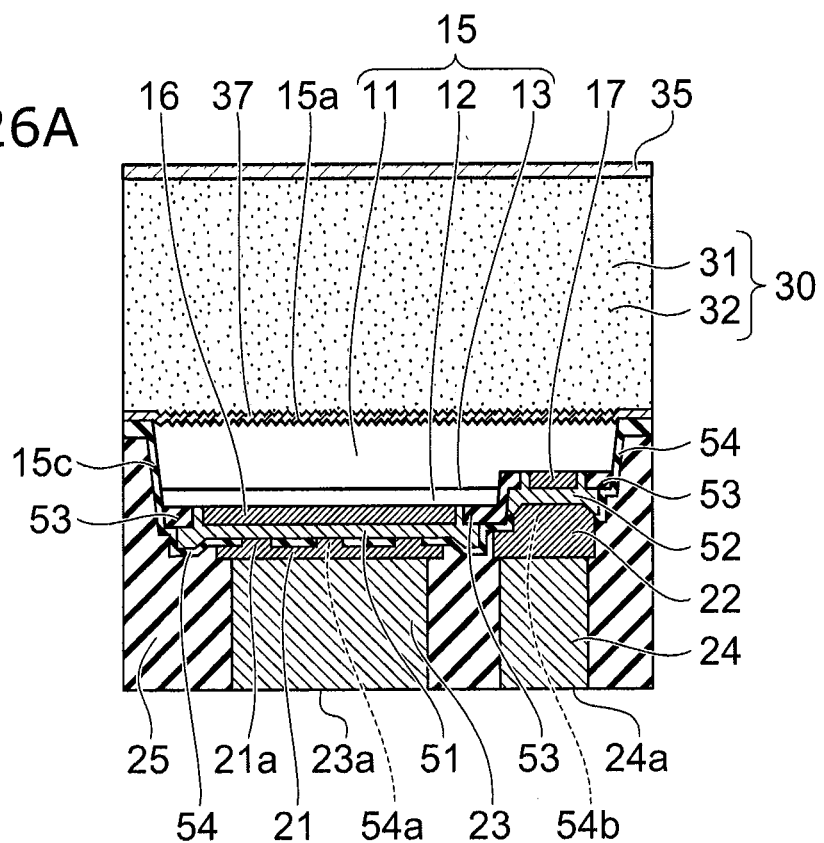

FIG. 26A shows a configuration in which the adhesion layer 37 is provided between the first face 15a and the phosphor layer 30 under the configuration shown in FIG. 19A. In the configuration shown in FIG. 26A, as shown in FIG. 22B, the transparent film 35 disposed on the phosphor layer 30 may not be provided.

Figure 26B:
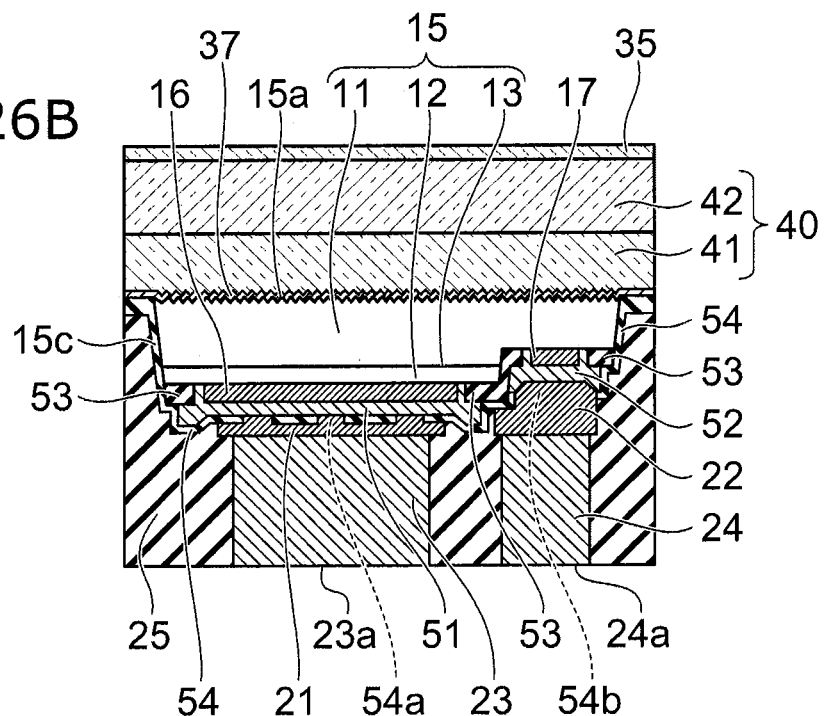

FIG. 26B shows a configuration in which the adhesion layer 37 is provided between the first face 15a and the phosphor layer 30 under the configuration shown in FIG. 19B. In addition, in the configuration shown in FIG. 26B, the transparent film 35 is provided on the phosphor layer 30.

Figure 27A:
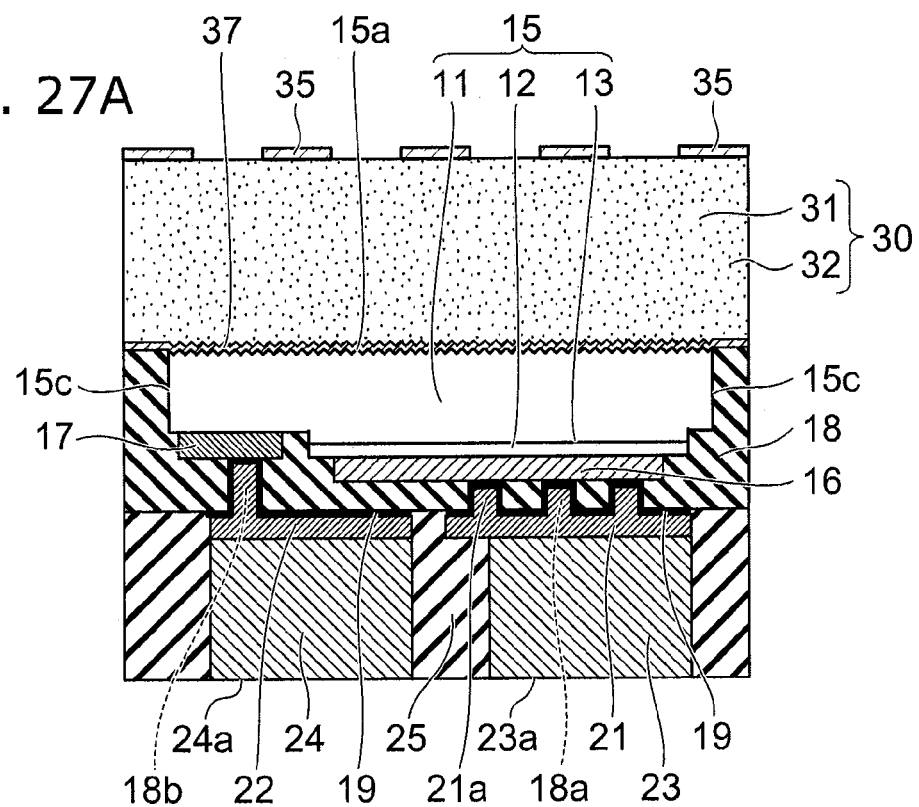
Figure 27B:
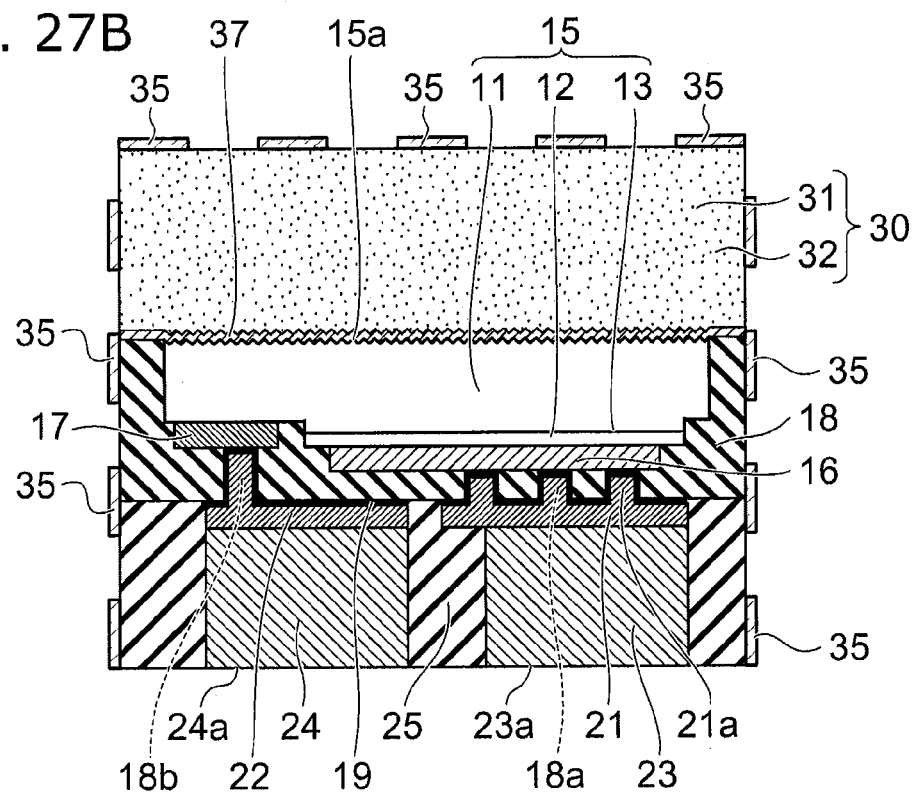

FIG. 27A shows a configuration in which the adhesion layer 37 is provided between the first face 15a and the phosphor layer 30 under the configuration shown in FIG. 20A. FIG. 27B shows a configuration in which the adhesion layer 37 is provided between the first face 15a and the phosphor layer 30 under the configuration shown in FIG. 20B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
 a semiconductor layer having a first face, a second face opposite to the first face, and a light emitting layer;
 a p-side electrode provided on the second face in an area including the light emitting layer;
 an n-side electrode provided on the second face in an area not including the light emitting layer;
 a phosphor layer provided on the first face and including a transparent resin and phosphor dispersed in the transparent resin; and
 a transparent film provided on an external face of the phosphor layer and having an adhesiveness at an external face thereof lower than an adhesiveness of the external face of the transparent resin.

2. The device according to claim 1, wherein the transparent film is thinner than the phosphor layer.

3. The device according to claim 2, wherein the transparent film is transparent to light of a wavelength and the transparent film has a thickness that is ¼ or less of the wavelength.

4. The device according to claim 1, wherein the transparent film is provided also on a side surface of the phosphor layer.

5. The device according to claim 1, further comprising:
 a first insulating film provided on a side of the second face and including a first opening to the p-side electrode and a second opening to the n-side electrode;
 a p-side interconnection part provided on the first insulating film and electrically connected to the p-side electrode through the first opening; and
 an n-side interconnection part provided on the first insulating film and electrically connected to the n-side electrode through the second opening.

6. The device according to claim 5, wherein the first insulating film covers a side surface that extends from the first face of the semiconductor layer.

7. The device according to claim 5, further comprising a second insulating film provided between the p-side interconnection part and the n-side interconnection part.

8. The device according to claim 7, wherein the second insulating film covers a periphery of the p-side interconnection part and a periphery of the n-side interconnection part.

9. The device according to claim 5, wherein
 the p-side interconnection part includes:
 a p-side interconnection layer provided inside the first opening and on the first insulating film; and
 a p-side metal pillar provided on the p-side interconnection layer and being thicker than the p-side interconnection layer, and
 the n-side interconnection part includes:
 an n-side interconnection layer provided inside the second opening and on the first insulating film; and
 an n-side metal pillar provided on the n-side interconnection layer and being thicker than the n-side interconnection layer.

10. A semiconductor light emitting device comprising:
 a semiconductor layer having a first face, a second face opposite to the first face, and a light emitting layer, the semiconductor layer containing gallium nitride;
 a p-side electrode provided on the second face in an area including the light emitting layer;
 an n-side electrode provided on the second face in an area not including the light emitting layer;
 a transparent stacked film provided on the first face and having a refractive index that is between refractive indices of gallium nitride and air, the transparent stacked film not including a phosphor;
 a first insulating film provided on the second face side, and including a first opening to the p-side electrode and a second opening to the n-side electrode, a portion of the first insulating film being provided on a side surface of the semiconductor layer that extends from the first face;
 a p-side interconnection part electrically connected to the p-side electrode through the first opening;
 an n-side interconnection part provided on the first insulating film and electrically connected to the n-side electrode through the second opening; and
 a second insulating film provided between the p-side interconnection part and the n-side interconnection part, a portion of the second insulating film being provided on the side surface of the semiconductor layer, wherein
 the transparent stacked film includes:
 an organic film provided to be in contact with the first face; and
 a transparent film of one or more layers and provided on the organic film, a refractive index of the transparent film being lower than a refractive index of the organic film, and the transparent stacked film is provided on the portions of the first and second insulating films provided on the side surface of the semiconductor layer.

11. The device according to claim 10, wherein concavo-convex is provided on the first face, and a top face of the organic film covering the concavo-convex is flat.

12. The device according to claim 10, further comprising:
a first insulating film provided on a side of the second face and including a first opening to the p-side electrode and a second opening to the n-side electrode;
a p-side interconnection part provided on the first insulating film and electrically connected to the p-side electrode through the first opening; and
an n-side interconnection part provided on the first insulating film and electrically connected to the n-side electrode through the second opening.

13. The device according to claim 12, wherein the first insulating film covers the side surface that extends from the first face of the semiconductor layer.

14. The device according to claim 12, further comprising a second insulating film provided between the p-side interconnection part and the n-side interconnection part.

15. The device according to claim 14, wherein the second insulating film covers a periphery of the p-side interconnection part and a periphery of the n-side interconnection part.

16. The device according to claim 12, wherein
the p-side interconnection part includes:
a p-side interconnection layer provided inside the first opening and on the first insulating film; and
a p-side metal pillar provided on the p-side interconnection layer and being thicker than the p-side interconnection layer, and
the n-side interconnection part includes:
an n-side interconnection layer provided inside the second opening and on the first insulating film; and
an n-side metal pillar provided on the n-side interconnection layer and being thicker than the n-side interconnection layer.

17. A semiconductor light emitting device comprising:
a semiconductor layer having a first face, a second face opposite to the first face, and a light emitting layer;
a p-side electrode provided on the second face in an area including the light emitting layer;
an n-side electrode provided on the second face in an area not including the light emitting layer;
a transparent body provided on the first face;
an adhesion layer that is provided between the first face and the transparent body and has an adhesiveness to the transparent body that is higher than an adhesiveness of the semiconductor layer to the transparent body;
a first insulating film provided on the second face side, and including a first opening to the p-side electrode and a second opening to the n-side electrode, a portion of the first insulating film being provided on a side surface of the semiconductor layer that extends from the first face;
a p-side interconnection part electrically connected to the p-side electrode through the first opening;

an n-side interconnection part provided on the first insulating film and electrically connected to the n-side electrode through the second opening; and
a second insulating film provided between the p-side interconnection part and the n-side interconnection part, a portion of the second insulating film being provided on the side surface of the semiconductor layer, wherein
the transparent body is provided on the portions of the first and second insulating films provided on the side surface of the semiconductor layer.

18. The device according to claim 17, wherein the first insulating film covers the side surface that extends from the first face of the semiconductor layer.

19. The device according to claim 17, wherein the second insulating film covers a periphery of the p-side interconnection part and a periphery of the n-side interconnection part.

20. The device according to claim 17 wherein
the p-side interconnection part includes:
a p-side interconnection layer provided inside the first opening and on the first insulating film; and
a p-side metal pillar provided on the p-side interconnection layer and being thicker than the p-side interconnection layer, and
the n-side interconnection part includes:
an n-side interconnection layer provided inside the second opening and on the first insulating film; and
an n-side metal pillar provided on the n-side interconnection layer and being thicker than the n-side interconnection layer.

21. The device according to claim 1, further comprising:
a first insulating film provided on the second face side and including a first opening to the p-side electrode and a second opening to the n-side electrode;
a p-side interconnection part electrically connected to the p-side electrode through the first opening;
an n-side interconnection part electrically connected to the n-side electrode through the second opening; and
a second insulating film provided between the p-side interconnection part and the n-side interconnection part.

22. The device according to claim 21, wherein the n-side interconnection part is provided on the first insulating film.

23. The device according to claim 21, wherein the first insulating film and the second insulating film are also provided on an outside of a side surface of the semiconductor layer.

24. The device according to claim 23, wherein the phosphor layer is provided on the portions of first and second insulating films that are provided on the side surface of the semiconductor layer.

25. The device according to claim 1, wherein the transparent film is exposed on the outside of the device.

26. The device according to claim 1, wherein the transparent film forms an external surface of the device.

27. The device according to claim 10, wherein the transparent film includes two or more layers and each respective layer of the transparent film has a refractive index that is less than that of any other layer of the transparent film that is between the respective layer and the organic film.

* * * * *